(12) United States Patent
Hunt et al.

(10) Patent No.: US 7,299,148 B2
(45) Date of Patent: Nov. 20, 2007

(54) METHODS AND APPARATUS FOR LOW DISTORTION PARAMETER MEASUREMENTS

(75) Inventors: Dean Hunt, Danville, CA (US); Costas J. Spanos, Lafayette, CA (US); Michael Welch, Livermore, CA (US); Kameshwar Poolla, Berkeley, CA (US); Mason L. Freed, Pleasant Hill, CA (US)

(73) Assignee: OnWafer Technologies, Inc., Santa Clara, CA (US)

(*) Notice: Subject to any disclaimer, the term of this patent is extended or adjusted under 35 U.S.C. 154(b) by 114 days.

(21) Appl. No.: 11/177,922

(22) Filed: Jul. 8, 2005

(65) Prior Publication Data
US 2006/0052969 A1 Mar. 9, 2006

Related U.S. Application Data

(60) Provisional application No. 60/586,891, filed on Jul. 10, 2004.

(51) Int. Cl.
*G01K 1/12* (2006.01)
(52) U.S. Cl. .................................... 702/130
(58) Field of Classification Search ............ 702/62, 702/99, 104, 116, 117, 130–132, 136, 183; 257/620; 73/862.045
See application file for complete search history.

(56) References Cited

U.S. PATENT DOCUMENTS

| | | | |
|---|---|---|---|
| 5,444,637 A | 8/1995 | Smesny et al. | 364/556 |
| 5,907,820 A | 5/1999 | Pan | 702/155 |
| 5,967,661 A | 10/1999 | Renken et al. | 374/126 |
| 5,969,639 A | 10/1999 | Lauf et al. | 340/870.17 |
| 6,033,922 A | 3/2000 | Rowland et al. | 438/14 |
| 6,244,121 B1* | 6/2001 | Hunter | 73/865.9 |
| 6,542,835 B2 | 4/2003 | Mundt | 702/65 |
| 6,691,068 B1 | 2/2004 | Freed et al. | 702/187 |
| 6,738,722 B2 | 5/2004 | Polla et al. | 702/104 |
| 6,741,945 B2 | 5/2004 | Polla et al. | 702/104 |
| 6,889,568 B2 | 5/2005 | Renken | 73/866.1 |
| 2003/0101006 A1* | 5/2003 | Mansky et al. | 702/30 |

OTHER PUBLICATIONS

U.S. Appl. No. 60/586,891, filed Jul. 10, 2004, Inventor(s) Dean Hunt, Costas J. Spanos, Michael Welch, and Kameshwar Poolla.

* cited by examiner

*Primary Examiner*—Eliseo Ramos-Feliciano
*Assistant Examiner*—Mohamed Charioui
(74) *Attorney, Agent, or Firm*—Larry Williams

(57) ABSTRACT

This invention seeks to provide methods and apparatus that can improve the accuracy of measured parameter data used for processing workpieces. One aspect of the present invention includes methods of measuring process conditions with low distortion of the measurements caused by the measuring apparatus. The measurements include data for applications such as data for monitoring, controlling, and optimizing processes and process tools. Another aspect of the present invention includes apparatus for measuring substantially correct data for applications such as generating data for monitoring, controlling, and optimizing processes and process tools.

23 Claims, 15 Drawing Sheets

METHODS AND APPARATUS FOR LOW DISTORTION PARAMETER MEASUREMENTS

CROSS-REFERENCE

The present application claims benefit of U.S. Patent Application Ser. No. 60/586,891, filed 10 Jul. 2004. The present application is related to U.S. Patent Application Ser. No. 60/586,891, filed 10 Jul. 2004, U.S. Pat. No. 6,691,068 filed 22 Aug. 2000, U.S. Pat. No. 6,738,722 filed 19 Apr. 2002, U.S. Pat. No. 6,741,945 filed 19 Apr. 2002; all of these patents are incorporated herein, in their entirety, by this reference.

TECHNICAL FIELD

This invention relates to methods and apparatus for measuring substantially correct parameter data for processing workpieces, more particularly, to processing workpieces for electronic device fabrication.

BACKGROUND

The processing of workpieces for the production of high value products requires accurate measurements of the process parameters for optimization and precise control of the processing steps. The accuracy and reliability of the parameter measurements are critical factors in determining the process capability and product yield.

Descriptions of some of the available technologies and sensor apparatuses for measuring process parameters are available in the technical and patent literature. Examples of some of the technologies are described in U.S. Pat. No. 6,741,945, U.S. Pat. No. 6,738,722, U.S. Pat. No. 6,691,068, U.S. Pat. No. 6,542,835, U.S. Pat. No. 6,244,121, U.S. Pat. No. 6,051,443, U.S. Pat. No. 6,033,922, U.S. Pat. No. 5,989,349, U.S. Pat. No. 5,967,661, and U.S. Pat. No. 5,907,820; all of these patents are incorporated herein, in their entirety, by this reference.

Some of the available technologies use an electronics module that is coupled to the detectors on a support; the sensors and electronics module are part of a single unit that is exposed to the process conditions that are to be measured. The electronics module is necessary for a sensor apparatus with capabilities such as autonomous information processing capability, wireless communication capability, and other electronically controlled on-board capabilities. For some applications, the presence of the electronics module can produce distortions in the parameter measurements.

Of course, the module distortion effect may be ignored if a high degree of measurement accuracy is unnecessary. However, some of the critical process steps required for processing high-value workpieces such as semiconductor wafers for electronic devices and optical devices and substrates for flatpanel display fabrication do indeed require high accuracy for the measurements of the process parameters. For such applications, measurements of a parameter such as temperature need to be extremely accurate, particularly for temperature uniformity across the area of the workpiece. Furthermore, applications involved with the manufacture, calibration, research, and development of process equipment for processing high value substrates require high accuracy measurements since the operation of the equipment can be limited by the accuracy of the measurements. Inaccurate data can result in the loss of millions of dollars of product in some instances. Alternatively, the inaccurate data can result in the production of products having poorer performance because the process conditions were optimized based on the inaccurate data.

There are numerous applications requiring high accuracy methods and apparatuses for obtaining data such as spatially resolved and/or time resolved process parameter measurements with low parameter distortion. An example of an important application is the uniform processing of workpieces such as semiconductor wafers, flatpanel displays, and lithography masks. Furthermore, there is a need for high accuracy methods and apparatus capable of collecting process data in a substantially nonperturbing manner on process equipment running realistic process conditions.

SUMMARY

This invention seeks to provide methods and apparatus that can improve the accuracy of measured parameter data used for processing workpieces. One aspect of the present invention includes methods of measuring process conditions with low distortion of the measurements caused by the measuring apparatus. The measurements include data for applications such as data for monitoring, controlling, and optimizing processes and process tools. Another aspect of the present invention includes apparatus for measuring substantially correct data for applications such as generating data for monitoring, controlling, and optimizing processes and process tools.

It is to be understood that the invention is not limited in its application to the details of construction and to the arrangements of the components set forth in the following description or illustrated in the drawings. The invention is capable of other embodiments and of being practiced and carried out in various ways. In addition, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods, and systems for carrying out aspects of the present invention. It is important, therefore, that the claims be regarded as including such equivalent constructions insofar as they do not depart from the spirit and scope of the present invention.

The above and still further features and advantages of the present invention will become apparent upon consideration of the following detailed descriptions of specific embodiments thereof, especially when taken in conjunction with the accompanying drawings.

Figure 1:
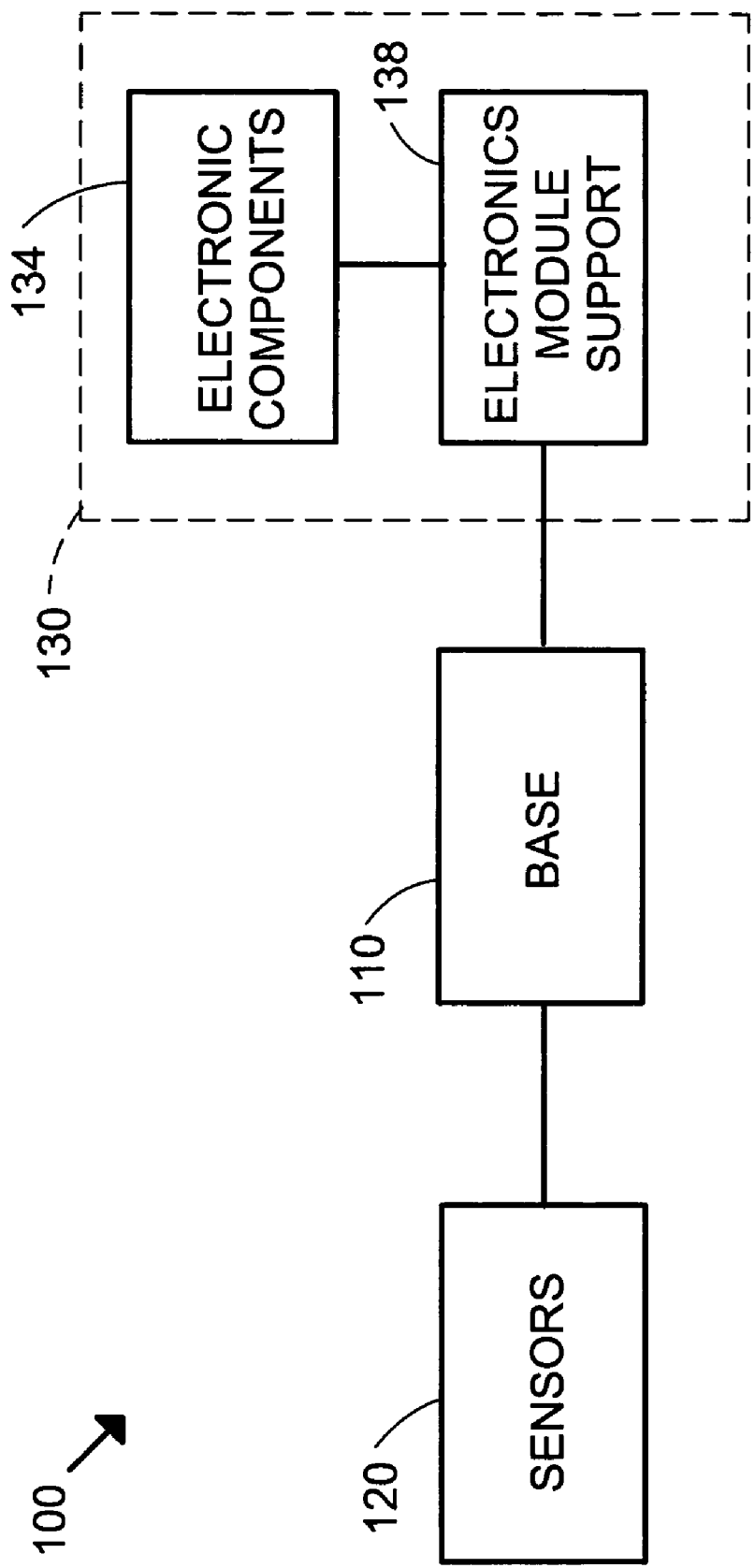
FIG. 1 is a box diagram of an embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DESCRIPTION

The operation of embodiments of the present invention will be discussed below primarily in the context of processes for electronic device fabrication such as those used for processing semiconductor devices, lithography masks, and flatpanel displays. In addition, much of the description is presented for the application of measuring temperature as the process characteristic. However, it is to be understood that embodiments in accordance with the present invention may be used for measuring process characteristics and generating response models for essentially any processing step involving a workpiece subjected to potential temporal and/or spatial variations in process conditions that may be a function of temperature. Embodiments of the present invention are not limited to the measurement of temperature nor are they limited to applications of electronic device fabrication.

In the following description of the figures, identical reference numerals have been used when designating substantially identical elements or steps that are common to the figures.

Reference is now made to FIG. 1 where there is shown a block diagram for a sensor apparatus 100 according to one embodiment of the present invention. Sensor apparatus 100 is configured so as to be capable of measuring parameter data for processing a workpiece. Sensor apparatus 100 includes a base 110, a sensor, preferably a plurality of sensors 120 supported on or in the base, and an electronics module 130. Electronics module 130 includes electronic components 134 and an electronics module support structure 138. In a preferred embodiment, electronic components 134 contain an information processor and additional electronic components that may be needed for the operation of the information processor. In general, electronics module 130 may contain a power source for the information processor. Electronics module 130 may also contain components for transmitting and receiving information such as, for example, components for wireless communication. Preferably, electronics module 130 comprises a printed circuit board for interconnecting the components of the electronics module and connecting the electronics module to the at least one sensor or sensors 120. Sensors 120 are connected with the information processor so as to allow signals generated by sensors 120 to be provided as input to the information processor. In other words, one embodiment of the present invention is an electronics module obtained using a method of interconnecting the components of the electronics module and connecting the electronics module to sensors 120.

Optionally, for some embodiments of the present invention for semiconductor processing applications, base 110 comprises a semiconductor wafer. Similarly, for flatpanel display applications, base 110 may comprise a flatpanel display substrate; for lithography mask applications, base 110 may comprise a lithography mask substrate. In preferred embodiments, base 110 is a structure such as a semiconductor wafer, a lithography mask substrate, and a flat panel display substrate. Generally, based 110 is configured so as to substantially mimic the workpiece; more preferably, base 110 comprises the workpiece.

Sensors 120 are designed to provide an electrical signal proportional to some basic, local process parameter that is representative of the process and process tool. Examples of process parameters of importance for applications such as semiconductor processing and flatpanel display processing include temperature, bow, stress/strain, etch rate, deposition rate, radio frequency (RF) field, plasma potential, thermal flux, ion flux, electromagnetic flux such as light, and any process parameter that is a function of temperature or is affected by temperature of the sensor apparatus.

Examples of typical sensor types include: Resistance Temperature Device (RTD) sensors for temperature measurement; thermistors for temperature measurement; defined area probes for measuring plasma potential and measuring ion flux; Van der Pauw crosses for measuring etch rate; isolated field transistors for measuring plasma potential; and current loops for measuring ion flux and measuring RF field. The numbers and types of sensors are selected based upon the specific application and process requirements.

For the case of measuring temperatures using a sensor apparatus, the presence of the electronics module will distort the temperature field being measured. It is possible to reduce the distortion by reducing the amount of energy flow into the electronics module from base 110, by reducing the thermal capacity of the electronics module and increasing the thermal resistance between base 110 and electronics module 130. The reduction of thermal capacity of electronics module 130 can be implemented by a) using very small components in the electronics components 134, thereby reducing module's overall size and hence thermal capacity, b) reducing the surface area and thickness of the electronics module support 138, again reducing thermal capacity, c) providing for open sides in the electronics module support 138, providing for no trapped gas and allowing convective heating of the exposed components. Additionally, convective heating of the electronic components 134 reduces the amount of energy drawn directly from base 110. The increase of the thermal resistance between base 110 and electronics module 130 can be implemented by a) reduction of surface contact area and elimination of adhesives between electronics module support 138 and base 110, b) reduction of the surface contact area between the electronic components 134 and the electronics module support 138. In reality, the module distortion effect cannot be entirely removed. However, embodiments of the present invention provide methods and apparatus for minimizing the distortion effect.

In one embodiment of the present invention, electronics module support structure 138 is configured so as to have a low thermal capacity and high thermal resistance relative to the base 110 for temperature equilibration for electronics module 130. As a consequence, electronics module support structure 138 is configured so as to maximize the time constant for the temperature equilibration for electronic components 134. Configuring electronics module 130 so as to have a low thermal mass minimizes the possible magnitude of the temperature distortion. Configuring electronics module 130 so as to have a longer time constant for temperature equilibration reduces the amplitude of the distortion and reduces the rate of heating of electronic components 134. This means that by lengthening the time constant one can improve the sensor performance during the early transient heating phase, and typically conclude the entire measurement cycle before electronic components 134 have reached undesirably high temperatures. In other words, the impact of the temperature distortion is suppressed so as to leave the transient temperature or temperature related information substantially unperturbed.

In another embodiment of the present invention, electronics module support structure 138 is configured so that the support structure has at least one of: a thermal resistance so that the measurements are substantially unperturbed by the presence of the electronics module and the electronics module is substantially undamaged by heat transferred from the base to the electronics module; and a thermal mass so that the measurements from the sensors are substantially unperturbed by the presence of the electronics module. The electronics module is configured so as to have heat transfer properties and heat capacity properties sufficient to substantially prevent thermal distortion of measurements made by the sensors.

For some applications, there may be a consequence as a result of the high thermal resistance between base 110 and electronics module 130 caused by the increased time constant for temperature equilibration of electronic components 134. More specifically, the electronics module may remain at temperatures that are different from those of the base. This temperature difference may be undesirable for some applications. In an alternative embodiment of the present invention, the properties of the electronics module are selected so that the electronics module reaches an equilibrium temperature that is substantially the same as the temperature of the base while exchanging a minimum amount of heat with the base. In one arrangement, the electronics module may draw heat by convection from surrounding gas.

For one embodiment of the present invention, electronic components 134 include a battery for providing power to the information processor and other electronic components needing power. Some commercially available batteries suitable for use in embodiments of the present invention are temperature sensitive. For example, some batteries cannot operate at high temperatures; the performance of some batteries is eroded by rapid temperature variations of the battery. Other elements of electronic components 134 may also be temperature sensitive. In other words, it is preferable in sensor apparatus technology to avoid high temperatures or rapid temperature excursions for electronics module 134. Configuring electronics module 130 so as to have a long time constant for temperature equilibration helps to alleviate some of the problems with the temperature sensitivity of electronic components 134; this benefit is achieved in addition to reducing the temperature distortion of the measurements as a result of the presence of the electronics module. This also means that a temperature sensitive battery is now only slowly heated and cooled, thus prolonging the battery lifetime and reducing the cost of ownership for the sensor apparatus.

Figure 2:
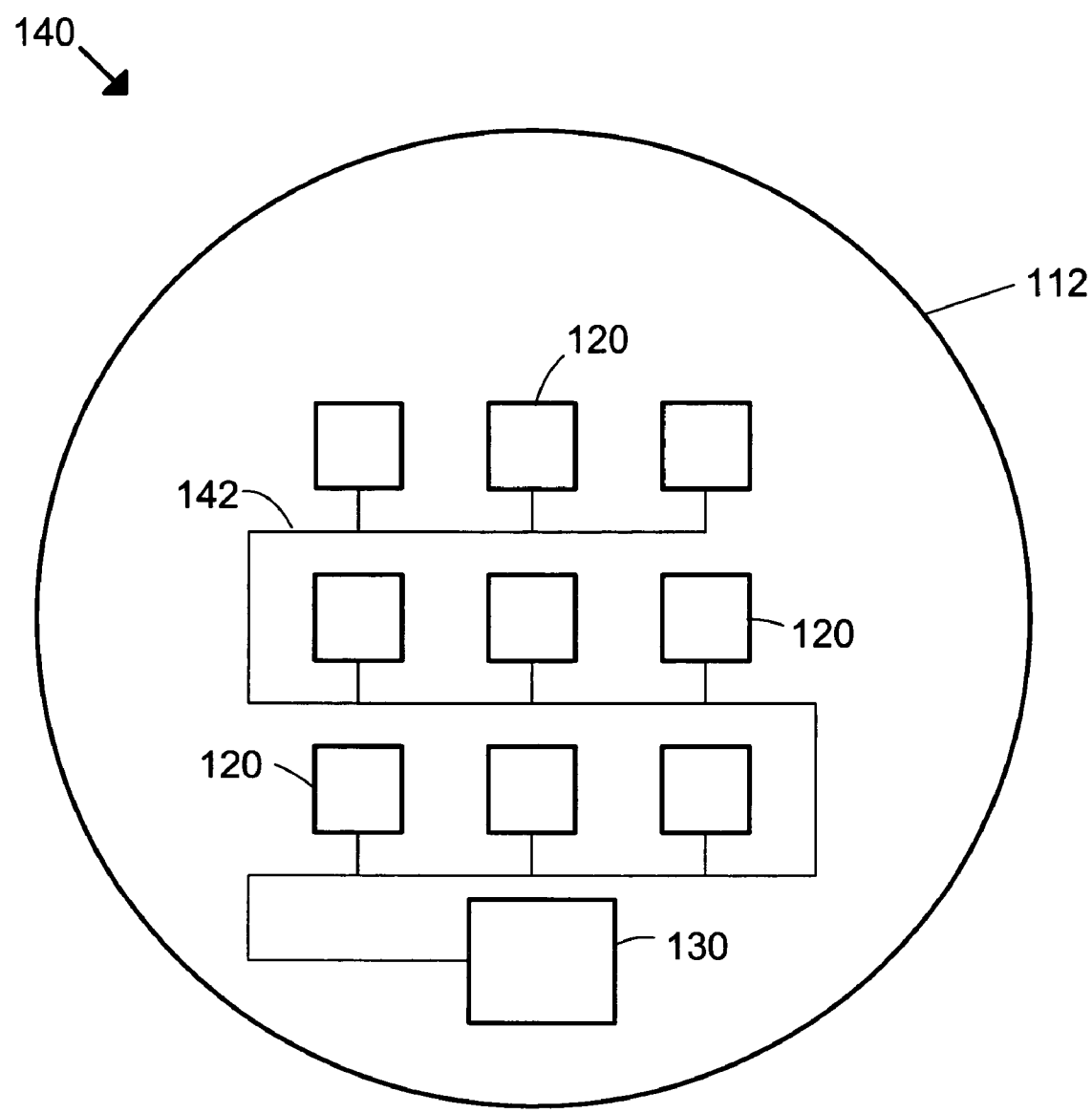
FIG. 2 is a diagram showing a top view of an embodiment of the present invention.

Reference is now made to FIG. 2 where there is shown a top view of a sensor apparatus 140 according to one embodiment of the present invention. Sensor apparatus 140 includes a base 112, a plurality of sensors 120, an electronics module 130, and metallization lines 142 connecting sensors 120 with electronics module 130. Base 112 comprises a substantially whole semiconductor wafer such as a silicon wafer and such as a gallium arsenide wafer. Sensors 120 and electronics module 130 are supported on base 112. Base 112, sensors 120, and electronics module 130 are essentially the same as those described for the embodiment in FIG. 1. More specifically, electronics module 130 is configured so as to have a low thermal mass and a long time constant for temperature equilibration.

Figure 3:
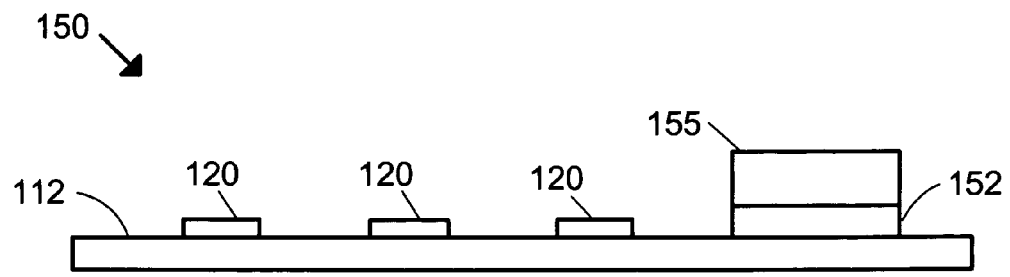
FIG. 3 is a diagram showing a side view of an embodiment of the present invention.

A variety of configurations may be used for the electronics module in embodiments of the present invention. Some example embodiments will now be presented with reference to FIG. 3, FIG. 4, FIG. 5, FIG. 6, FIG. 7, and FIG. 8. A diagram of a side view of a sensor apparatus 150 according to one embodiment of the present invention is shown in FIG. 3. Sensor apparatus 150 includes a base 112, sensors 120, and an electronics module that includes an electronics module support structure 152 and electronic components 155. Electronics module support structure 152 is shown supporting electronic components 155 above base 112. In other words, support structure 152 separates electronic components 155 from base 112, and support structure 152 physically connects base 112 and electronics components 155.

For embodiments of the present invention, support structure 152 does not have the requirements of including electronic components like those of electronic components 155. Consequently, it is preferred that support structure 152 is configured so that it has a low mass and a low specific heat capacity so as to provide a low heat capacity for the part of the electronics module that physically contacts base 112. The rate of heat transfer from base 112 is reduced further by having support structure 152 configured so as to have a low thermal conductivity and configured so as to have a small area of contact with base 112 so as to yield a low rate of heat transfer. Preferably, support structure 152 is configured so as to have a high heat transfer contact resistance between support structure 152 and base 112; the support structure is configured so as to have heat transfer properties and heat capacity properties sufficient to substantially prevent thermal distortion of measurements made by the plurality of sensors. In other words, a preferred embodiment of the present invention includes support structure 152 configured so as to have a low mass, a low specific heat capacity, a low thermal conductivity, a high thermal contact resistance, and a small contact area with base 112.

Figure 4:
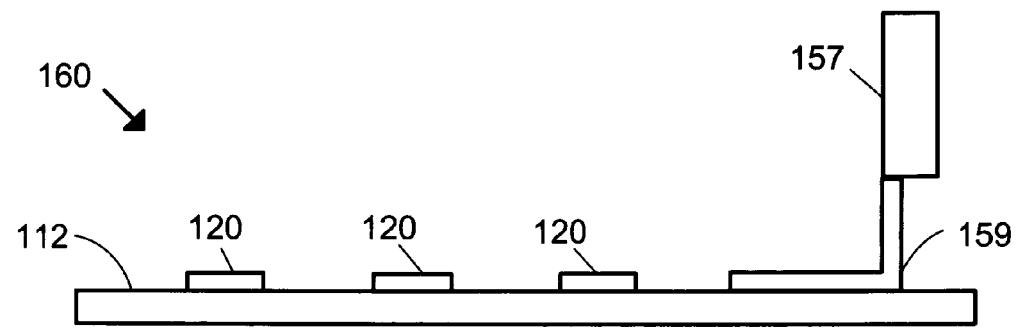
FIG. 4 is a diagram showing a side view of an embodiment of the present invention.
Figure 5:
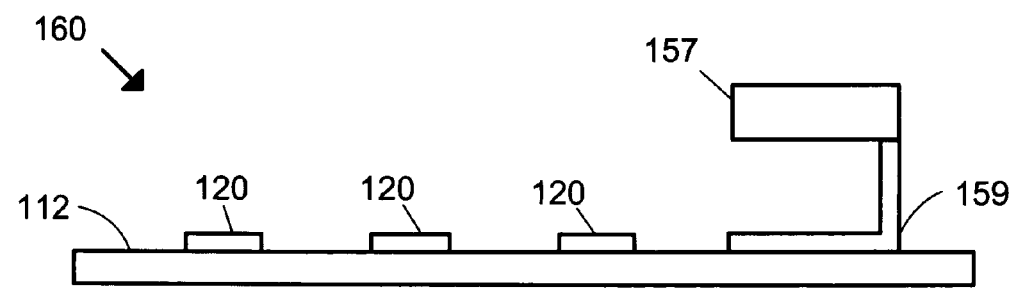
FIG. 5 is a diagram showing a side view of an embodiment of the present invention.

Reference is now made to FIG. 4 and FIG. 5 where there is shown a side view of a sensor apparatus 160 according to one embodiment of the present invention. Sensor apparatus 160 includes a base 112, sensors 120, and an electronics module that includes electronic components 157 and an electronics module support structure 159. Base 112 and sensors 120 are essentially the same as those described for the embodiment in FIG. 1. For the embodiment shown in FIG. 4, the electronics module is separated into two parts. Electronics module support structure 159 is configured so that part of support structure 159 physically contacts the surface of base 112 and another part of support structure 159 extends away from the surface of base 112 so that the part of structure 159 that extends away from the surface of base 112 can support electronic components 157 away from the surface of base 112. In a more preferred embodiment, support structure 159 and electronic components 157 have a hinge-like connection so that electronic components 157 can be put into an opened positioned as illustrated in FIG. 4 or moved into a closed position as illustrated in FIG. 5. A variety of configurations can be used to produce a hinge-like connection between electronic components 157 and support structure 159; such configurations will be clear to one of ordinary skill in the art in view of the present disclosure.

Figure 6:
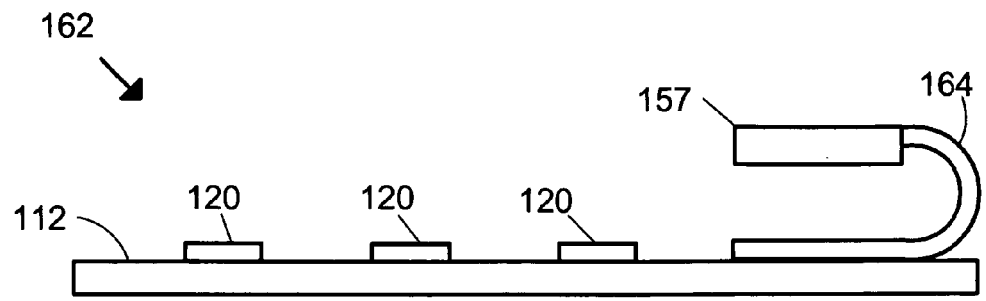
FIG. 6 is a diagram showing a side view of an embodiment of the present invention.

A preferred embodiment of the present invention is shown in FIG. 6 where there is illustrated a side view of a sensor apparatus 162. Sensor apparatus 162 includes a base 112, sensors 120, electronics module 157, and an electronics module support structure 164. For this embodiment, a hinge-like motion for electronic components 157 is achieved by configuring support structure 164 as a substantially flexible structure. In other words, support structure 164 is sufficiently flexible so as to allow electronic components 157 to be moved from a first position to a second position, such as back and forth from a closed position to an opened position.

Part of support structure 164 is connected with the surface of base 112 and another part of support structure 164 extends away from the surface of base 112 so that support structure 164 holds electronic components 157 away from the surface of base 112. In a preferred embodiment support structure 164 comprises a flexible circuit board such as commercially available flexible integrated circuit boards. Using a flexible circuit board for support structure 164 allows the electronics module to be configured so that the flexible circuit board provides physical support of electronic components 157 and also allows making electrical connections with metallization lines from sensors 120. In another embodiment, support structure 164 includes a substantially flexible ribbon cable for connection with electronic components 157. The ribbon cable is configured so as to be sufficiently stiff to allow electronic components 157 to be suspended away from the surface of base 112. The ribbon cable also provides electrical interconnection between electronic components 157 and the electrical connections with sensors 120. In yet another embodiment, support structure 164 may include a combination of a flexible circuit board and a ribbon cable.

Figure 7:
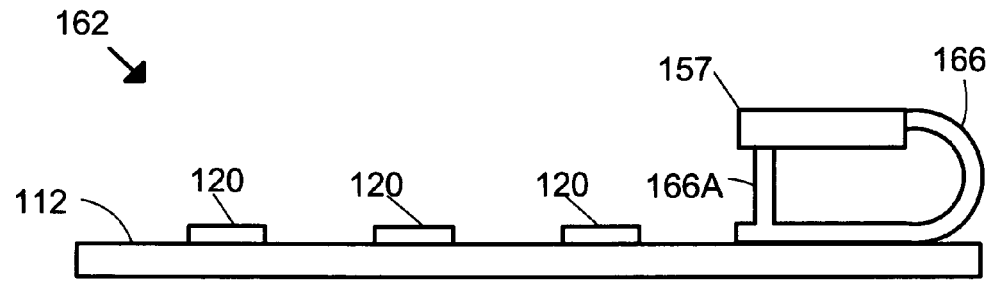
FIG. 7 is a diagram showing a side view of an embodiment of the present invention.

As stated supra, a preferred embodiment of the present invention is a sensor apparatus configured so that the electronic components are movably connected with respect to the base. In a more preferred embodiment, the electronic components can be held in the closed position using a releasable latch mechanism. In other words, the electronic components can be latched in the closed position or the latch can be released so that the electronic components can be moved into the opened position. This can be further illustrated with reference to FIG. 7 where there is shown a diagram of a side view of an embodiment of the present invention that includes a latch 166A. More specifically, FIG. 7 shows a sensor apparatus 162 that is substantially the same as that described for the embodiment presented in FIG. 6 with the exception that, instead of having a support structure 164, the embodiment of FIG. 7 includes a support structure 166 that has been configured to include a latch 166A for latching electronics module 157 into the closed position.

Figure 8:
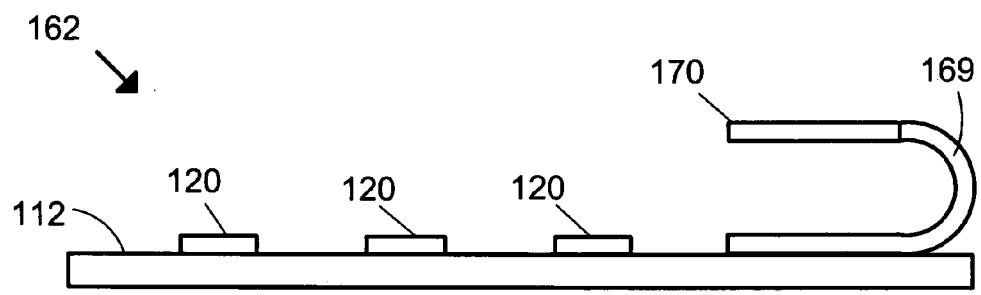
FIG. 8 is a diagram showing a side view of an embodiment of the present invention.

Reference is now made to FIG. 8 where there is shown a diagram of a side view of another embodiment of the present invention. FIG. 8 shows a sensor apparatus 162 that includes a base 112, sensors 120, an electronics module support structure 169, and electronic components (not shown in FIG. 8) on a flexible circuit board 170. Base 112 and sensors 120 are substantially the same as presented for the embodiment shown in FIG. 6 and FIG. 7. The electronic components (not shown in FIG. 8) for the embodiment in FIG. 8 are supported on a flexible circuit board 170 that is connected physically and connected electrically with support structure 169 so that the electronic components are suspended away from the surface of base 112 while being able to maintain an electrical connection with sensors 120.

Electronics module support structure 169 comprises a flexible circuit board. As an option, the flexible circuit board included in support structure 169 can also function as the flexible circuit board for the electronic components. In one embodiment of the present invention, a single continuous flexible circuit board is used for mounting the electronic components and for the electronics module support structure.

Figure 9:
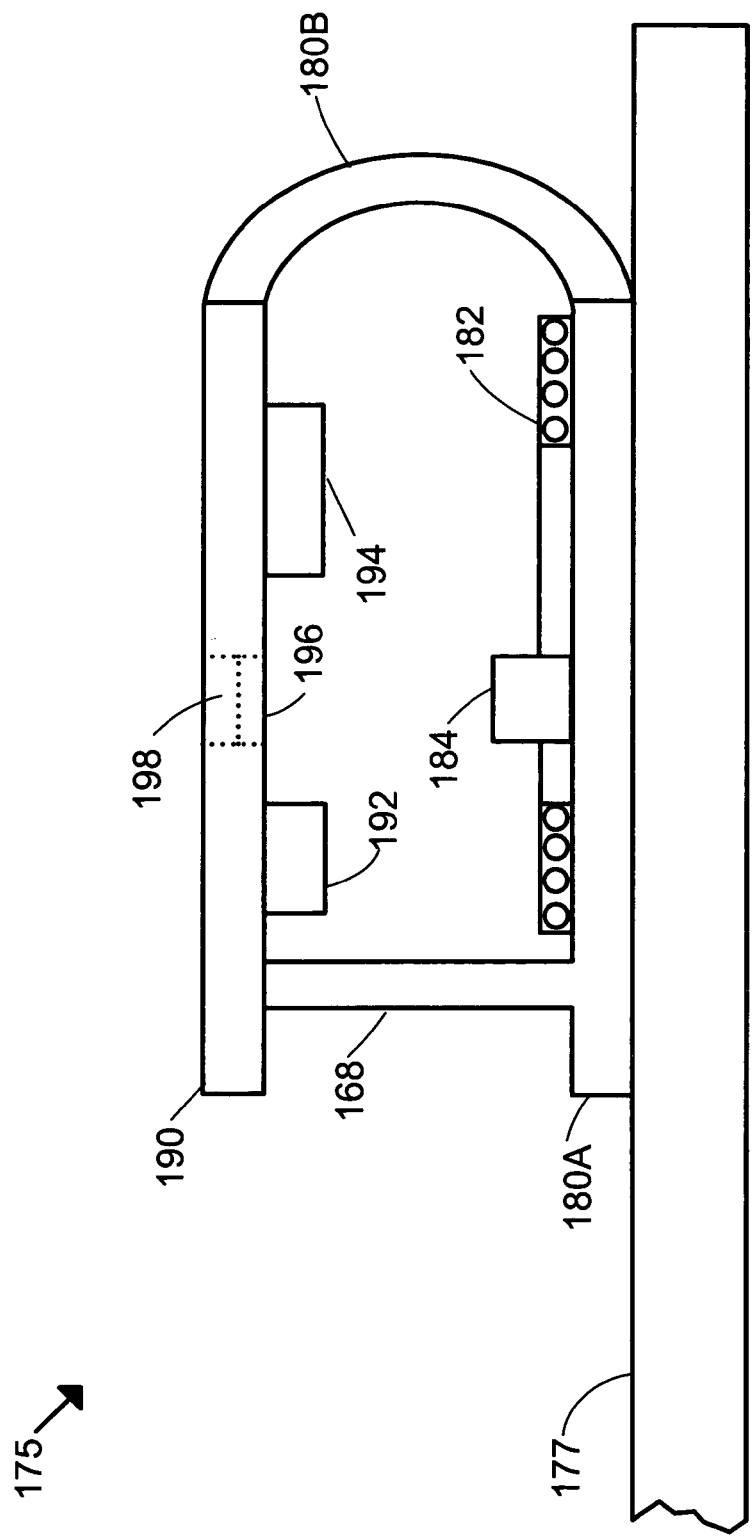
FIG. 9 is a diagram showing a side view of an embodiment of the present invention.

Reference is now made to FIG. 9 where there is shown an enlarged side view of a diagram of a sensor apparatus 175 according to one embodiment of the present invention. FIG. 9 shows part of a base 177 that is substantially the same as that described for FIG. 1. Sensor apparatus 175 also includes a plurality of sensors (sensors not shown in FIG. 9). Sensor apparatus 175 also includes a sensor apparatus support structure that includes a support structure flexible circuit board 180A and a short ribbon cable such as a ribbon cable 180B. FIG. 9 shows sensor apparatus 175 having a circuit board, preferably, a flexible circuit board 190 on which are mounted one or more electronic components such as electronic component 192 and electronic component 194. Is to be understood that embodiments of the present invention may be configured with a rigid circuit board replacing flexible circuit board 190. Electronic component 192 may be an electronic component such as a power source such as a battery. Electronic component 194 may be an electronic component such as an information processor such as a microprocessor.

Flexible circuit board 180A physically contacts the surface of base 177 and ribbon cable 180B extends away from the surface of base 177 so as to support flexible circuit board 190 away from the surface of base 177. The ribbon cable is configured to be sufficiently flexible so as to allow flexible circuit board 190 to be reversibly movable from a first position such as the opened position to a second position such as the closed position. Support structure flexible circuit board 180A further includes a latch 168 for holding circuit board 190 in the closed position. For one embodiment of the present invention, the closed position has the top surface of at least one of the electronic components pointing toward base 177 and substantially parallel to the surface of base 177; the opened position has the top surface of at least one electronic component substantially perpendicular to the surface of base 177.

The electronic components are mounted on a flexible circuit board to allow interconnections between the electronic components and to allow electrical connections to be made with the sensors. Optionally, some embodiments of the present invention may not include the use of a ribbon cable; instead, a flexible circuit board may make the connection between support structure flexible circuit board 180A and flexible circuit board 190. For embodiments of the present invention that include the ribbon cable, the ribbon cable should be configured so as to provide a high resistance to thermal conduction so as to minimize the rate of heat transfer between base 177 and the electronic components such as electronic component 192 and electronic component 194. In other words, the ribbon cable should be configured so as to minimize the rate of heat transfer and the amount of heat transfer to circuit board 190. The high resistance to thermal conduction can be achieved by selecting materials for the ribbon cable that have a low thermal conductivity. In addition, the ribbon cable should be configured so as to minimize the area for which heat can be conducted from base 177 to circuit board 190. More specifically, the cross-sectional area for the heat transfer through the ribbon cable should be minimized. For embodiments of the present invention that use a flexible circuit board instead of a ribbon cable, then the flexible circuit board replacing the ribbon cable should be designed to produce a high resistance to thermal conduction as described for the ribbon cable, i.e., low thermal conductivity and small cross sectional area for heat transfer.

Some embodiments of the present invention also include electronic components mounted on support structure flexible circuit board 180A. FIG. 9 shows a preferred embodiment that includes an induction coil 182 (shown in cross section) and optical communication device 184. Induction coil 182 and communication device 184 are mounted onto support structure flexible circuit board 180A. Induction coil 182 is a planar induction coil; induction coil 182 may be used for functions such as wirelessly coupling power to the electronics module and/or RF communication. Optical communication device 184 is configured for optical signal based communications to allow commands and/or data to be transmitted to and from the electronics module. In a more preferred embodiment, flexible circuit board 190 has a port 196 such as a hole or such as a window 198 for transmitting optical signals from communication device 184. Sensor apparatus 175 is configured so that port 196 is positioned substantially above communication device 184 for reduced obstruction transmission when flexible circuit board 190 is in the closed position.

Another embodiment of the present invention is an electronics module for a sensor apparatus configured for mounting on a base. The base has at least one sensor mounted thereon. The electronics module is connected with the at least one sensor so as to receive signals from the sensor. The electronics module includes a bottom section comprising a flexible circuit board having wiring and a plurality of electrical contacts, a top section comprising a flexible circuit board and a plurality of components for electronically processing information, and a middle section comprising a flexible circuit board coupled between the bottom section and the top section, wherein, the bottom section physically contacts the base for support and the middle section extends away from the base so as to suspend the top section away from the base.

Preferably, the top section is suspended so that the flexible circuit board of the top section is suspended so as to be substantially parallel to the flexible circuit board of the bottom section. Optionally, the electronics module further includes a wireless communication device mounted on the bottom section; the wireless communication device is configured so as to transmit electromagnetic signals, and the top section has a window for providing a low obstruction path for the electromagnetic signals. As another option, the electronics module includes a substantially planar induction coil mounted on the bottom section, the coil is configured for receiving inductively coupled power, and the coil is connected with the top section so as to provide power to at least one of the plurality of electronic components. Optionally, the electronics module includes an infrared communication device mounted on the bottom section; the top section has a window for providing a low absorption path for the infrared signals, and the window is positioned above the communication device. In another embodiment, the flexible circuit board of the top section is disposed so as to be substantially parallel to the flexible circuit board of the bottom section, and the plurality of components for electronically processing information are disposed on the underside of the top section. Another embodiment of the present invention includes an information processor and a detachable battery. More specifically, the electronics module is configured so that the battery is user replaceable; the electronics module includes a mechanical latching mechanism for releasably holding the battery. In a preferred embodiment, this mechanism and the replaceable battery can be accessed by the user when the electronics module is in the opened position.

Figure 10:
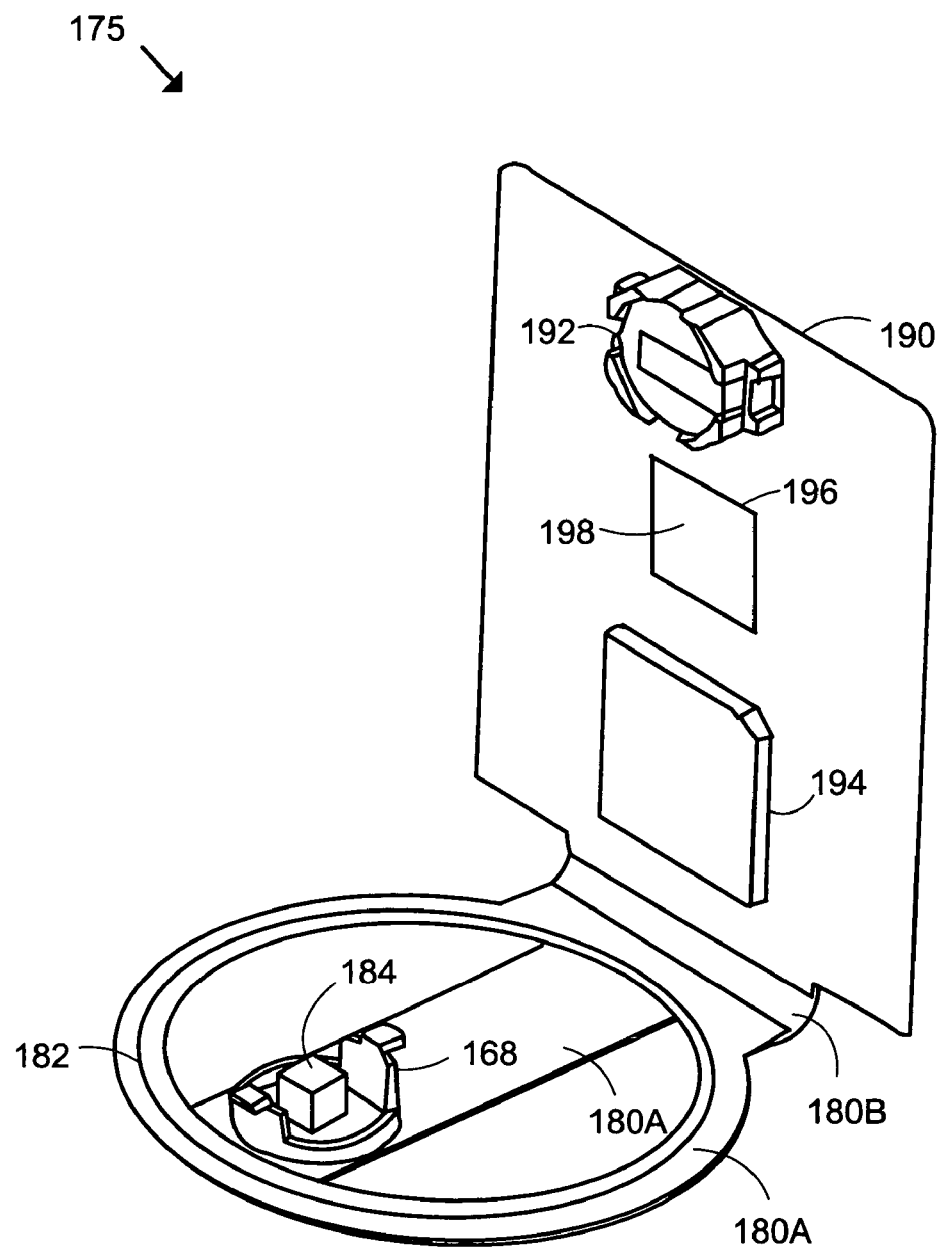
FIG. 10 is a diagram showing a perspective view of an electronics module according to one embodiment of the present invention.

Reference is now made to FIG. 10 wherein there is shown a perspective view of an embodiment of a sensor apparatus 175 according to the present invention. Sensor apparatus 175 shown in FIG. 10 is essentially the same as sensor apparatus 175 described in FIG. 9. Sensor apparatus 175 is shown in FIG. 10 with the electronics module in the opened position. Sensor apparatus 175 shown in FIG. 10 includes a base (the base is not shown in FIG. 10). The sensor apparatus shown in FIG. 10 includes a support structure comprising support structure flexible circuit board 180A and a ribbon cable 180B. Also shown are a flexible circuit board 190, an electronic component 192 such as a detachable battery, and an electronic component 194 such as an information processor. Electronic component 192 and electronic component 194 are attached to flexible circuit board 190. Circuit board 190 also includes a port 196 having a window 198 therein; window 198 is configured so as to provide a low obstruction path for communication signals. As an option in a preferred embodiment, window 198 may comprise a thin sheet of polyimide. FIG. 10 also shows an induction coil 182 and a communication device 184 supported on circuit board 180A. A latch mechanism 168 is also included as part of circuit board 180A.

For a more preferred embodiment of the present invention, sensor apparatus 175 is configured so that electrical connections between the electronics module and the sensors are made through solder connections with metallization lines electrically connected with the sensors. Preferably, the solder connections are the only rigid connection between the flexible portion of the electronics module and the base. In other words, it is preferred that no attachment means such as an adhesive is used to connect the electronics module to the base, and the connection uses a flexible portion of the electronics module, i.e., the wiring for the electronics module is soldered to the metallization lines connected to the sensors so that the electronics module is fixedly connected with the base. This arrangement provides a substantially flexible connection with the base that would be difficult to achieve using a rigid circuit board or a rigid housing for the electronics module. Consequently, the substantially flexible connection with the base reduces the amount of thermal stresses generated between the base and the electronics module. The reduced thermal stresses also reduce effects such as warpage of the base that could occur for a rigid electronics module for which the thermal expansion does not match that of the base. For embodiments of the present invention, the flexible connection with the electronics module can allow the electronics module to stretch so as to relieve possible thermal stresses, resulting in reduced failures caused by thermal stress.

A more preferred embodiment of the present invention is a sensor apparatus for measuring temperatures for processing silicon wafers. The sensor apparatus includes a substantially whole silicon wafer, a plurality of temperature sensors in physical contact with the silicon wafer so as to provide temperature measurements, and at least one electronics module mounted on the silicon wafer. The electronics module includes an information processor, a power supply, a flexible integrated circuit board comprising a material such as polyimide or another thermally stable polymer, and a support structure comprising a material such as polyimide or another thermally stable polymer. The information processor, the power supply, and the sensors are interconnected via the flexible circuit board so that the information processor can receive power from the power supply and signals from the sensors. The support structure is flexibly coupled to the flexible circuit board. The support structure has electrical circuits for transmitting signals from the sensors to the flexible circuit board. The support structure has a flexible portion for physical contact with the silicon wafer. The support structure is configured for suspending the information processor and the power supply away from the surface of the silicon wafer so as to provide a low rate of conductive heat transfer between the silicon wafer and the electronics module. The support structure includes a latch mechanism for holding the printed circuit board in a predetermined position.

In another embodiment, the support structure of the sensor apparatus is configured so as to provide a rate of conductive heat transfer between the silicon wafer or other base and the electronics module so that the temperature measurements from the sensors are substantially unperturbed by the presence of the electronics module and the electronics module is substantially undamaged by heat transferred from the base to the electronics module. In other words, the support structure is configured so that temperature sensitive components of the electronics module are not subjected to damaging temperatures during measurements, and the support structure is configured so as to have heat transfer properties and heat capacity properties sufficient to substantially prevent thermal distortion of measurements made by the plurality of sensors.

Embodiments of the present invention shown in FIG. 6 through FIG. 10 are configured so that at least two sides of the electronics module, when set in the closed position, do not have sidewalls. In other words, two facing sides are open, or two or more than two walls are open. This is a preferred configuration for some applications. For applications that involve a gas flow across the surface of a workpiece, the sides without walls can be oriented so as to minimize the disruption of gas flow across the surface of the sensor apparatus; as a result, the sensor apparatus will have surface gas flow dynamics that are more closely matched to the surface gas flow dynamics of a workpiece, which does not have an electronics module. A preferred configuration for a semiconductor wafer processing application with a gas flow between the center of the wafer and the edge of the wafer includes arranging the open sidewalls so that the direction of gas flow is substantially perpendicular to the open sides. In yet another embodiment, a round configuration is used for the electronics module and it is arranged so that there are substantially no walls.

In still another embodiment of the present invention, the electronics module has a middle section that comprises an elongated flexible circuit board or an elongated ribbon cable so that the top section can be disposed remotely from the base during operation. This embodiment could be used for high temperature applications (such as up to 250 or 300 C) for which standard electronics and the battery may not survive. This embodiment includes lengthening the connecting portion between the top section and the bottom section of the electronics module. In operation the electronic components could be kept at relatively lower temperature, by such means as by adopting special loading techniques suitable for the process chamber. More specifically, the middle section is long enough so that the top section can be held on a surface of the process tool within the process chamber during data collection. This configuration is desirable for applications where the process temperatures are too high for the electronic components when the electronic components are near the base of the sensor apparatus.

Figure 11:
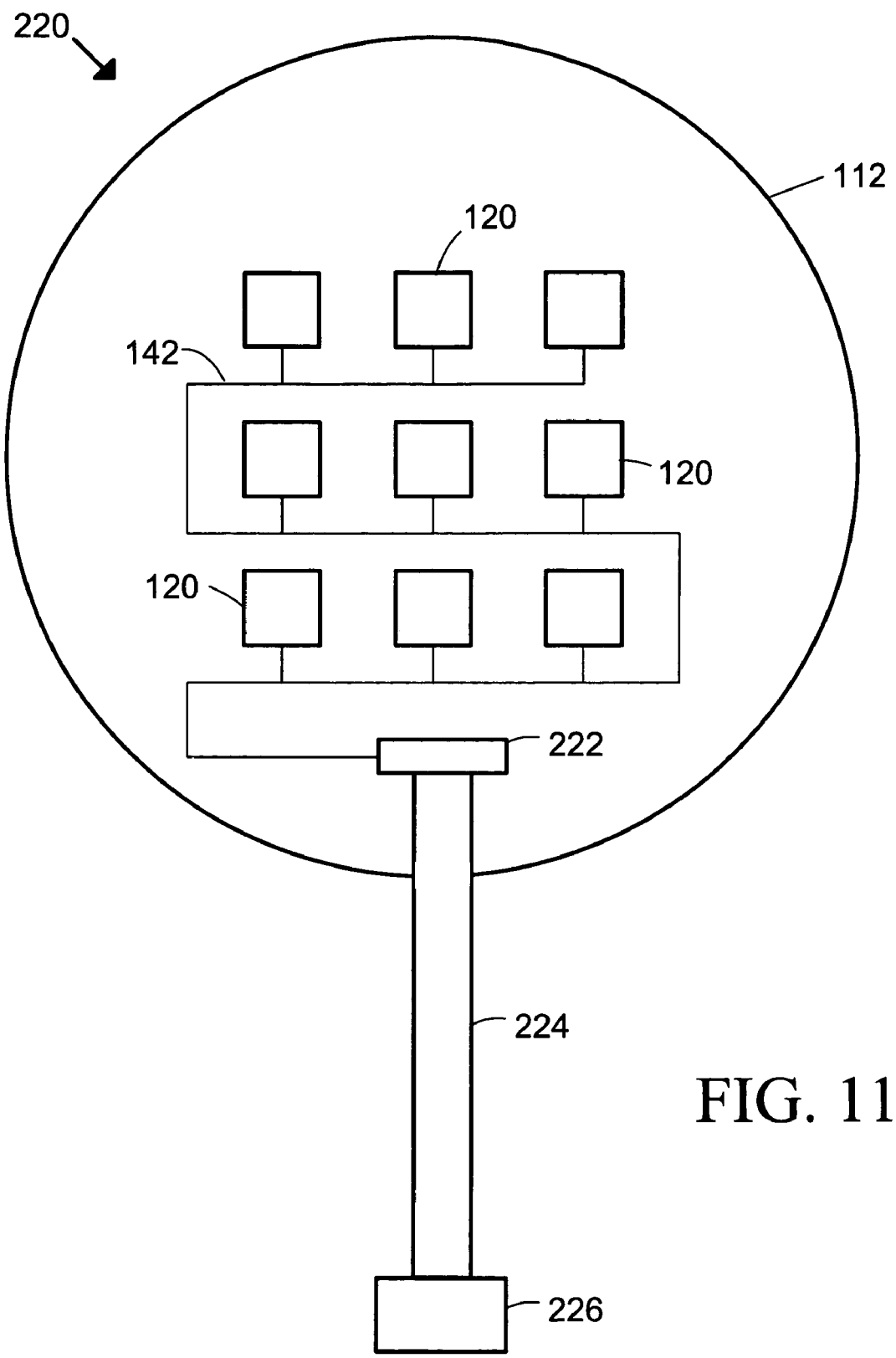
FIG. 11 is a diagram showing a top view of an embodiment of the present invention.

To further illustrate this embodiment, reference is now made to FIG. 11 where there is shown a diagram of a top view of a sensor apparatus 220 according to one embodiment of the present invention. Sensor apparatus 220 includes a base 112, a plurality of sensors 120, and metallization lines 142. Sensor apparatus 220 also includes an electronics module that comprises a support structure comprising a bottom section such as a support structure flexible circuit board 222, a middle section such as an elongated ribbon cable 224, and a remote section such as a flexible circuit board 226. In preferred embodiments, flexible circuit board 226 includes electronic components that may be particularly sensitive to harsh process conditions for electronic components such as high temperatures. Consequently, preferred embodiments of the present invention are configured so that flexible circuit board 226 includes electronic components such as a battery for providing power, one or more electronic components needed for functions such as information processing, and one or more electronic components for communication and information transmission and receiving. The electronic components are attached to flexible circuit board 226. Apparatus 220 also includes metallization lines 142 for connecting sensors 120 with the electronics module. As an option for some embodiments of the present invention, the remote section may comprise a rigid circuit board instead of a flexible circuit board. As another option for some embodiments of the present invention, the bottom section may comprise a rigid circuit board instead of a flexible circuit board.

In preferred embodiments, base 112 comprises a substantially whole semiconductor wafer such as a silicon wafer and such as a gallium arsenide wafer. Base 112 and sensors 120 are essentially the same as those described for the embodiment in FIG. 1. The electronics module is also essentially the same as that described for the embodiments shown in FIG. 9 and FIG. 10 with the exception of the increased length for ribbon cable 224 and the placement of some of the electronic components. As an option stated earlier, the electronics module may include an induction coil. For the embodiment shown in FIG. 11, the induction coil may be included on support structure flexible circuit board 222 or included on flexible circuit board 226. In general, the electronics module is configured so as to have a substantially negligible effect on the measurements made by the sensor apparatus while allowing use of sensor apparatus 220 at elevated temperatures such as temperatures that may be too high for the operation of commonly available electronic devices. Consequently, it is preferred for ribbon cable 224 to have a low thermal mass and a long time constant for temperature equilibration. It is to be understood that ribbon cable 224 is a preferred embodiment; other embodiments may use an elongated flexible printed circuit board instead of ribbon cable 224.

Figure 12:
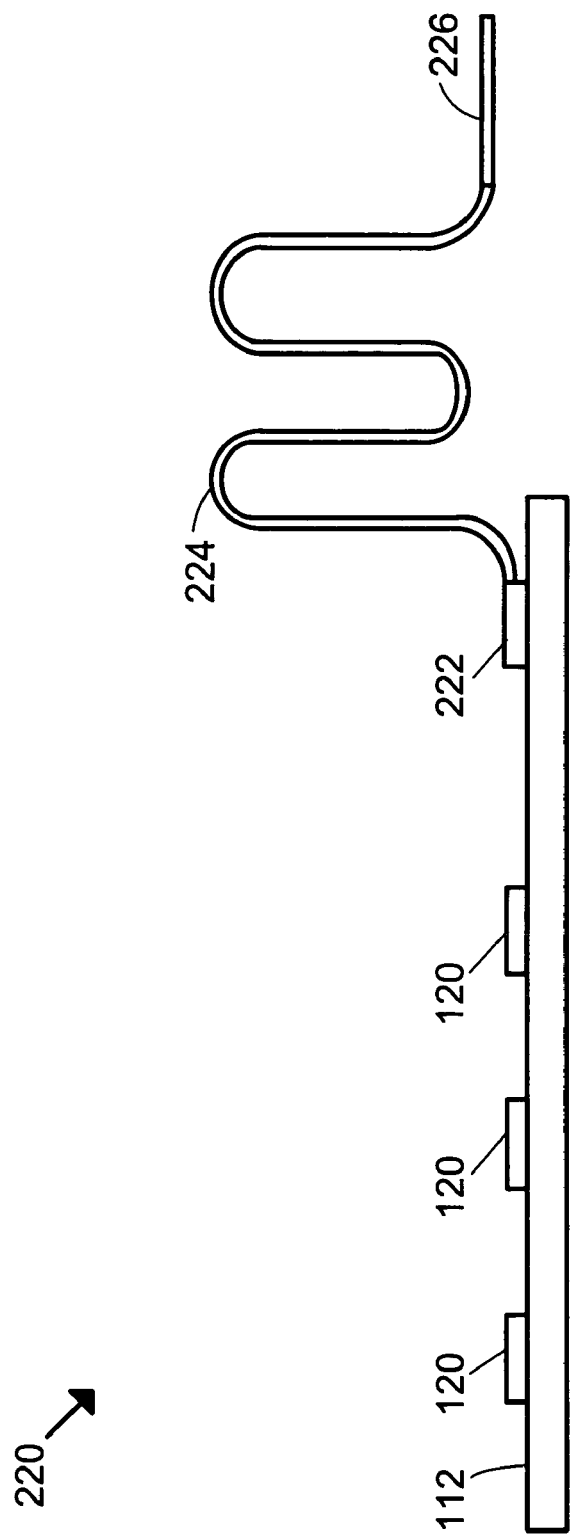
FIG. 12 is a diagram showing a side view of an embodiment of the present invention.

Reference is now made to FIG. 12 where there is shown a diagram of a side view of a sensor apparatus 220 according to one embodiment of the present invention. Sensor apparatus 220 shown in FIG. 12 is essentially the same as the sensor apparatus shown in FIG. 11. Sensor apparatus 220 shown in FIG. 12 is illustrated with ribbon cable 224 partially folded. In preferred embodiments, ribbon cable 224 is configured so that it can be folded and extended repeatedly.

Figure 13:
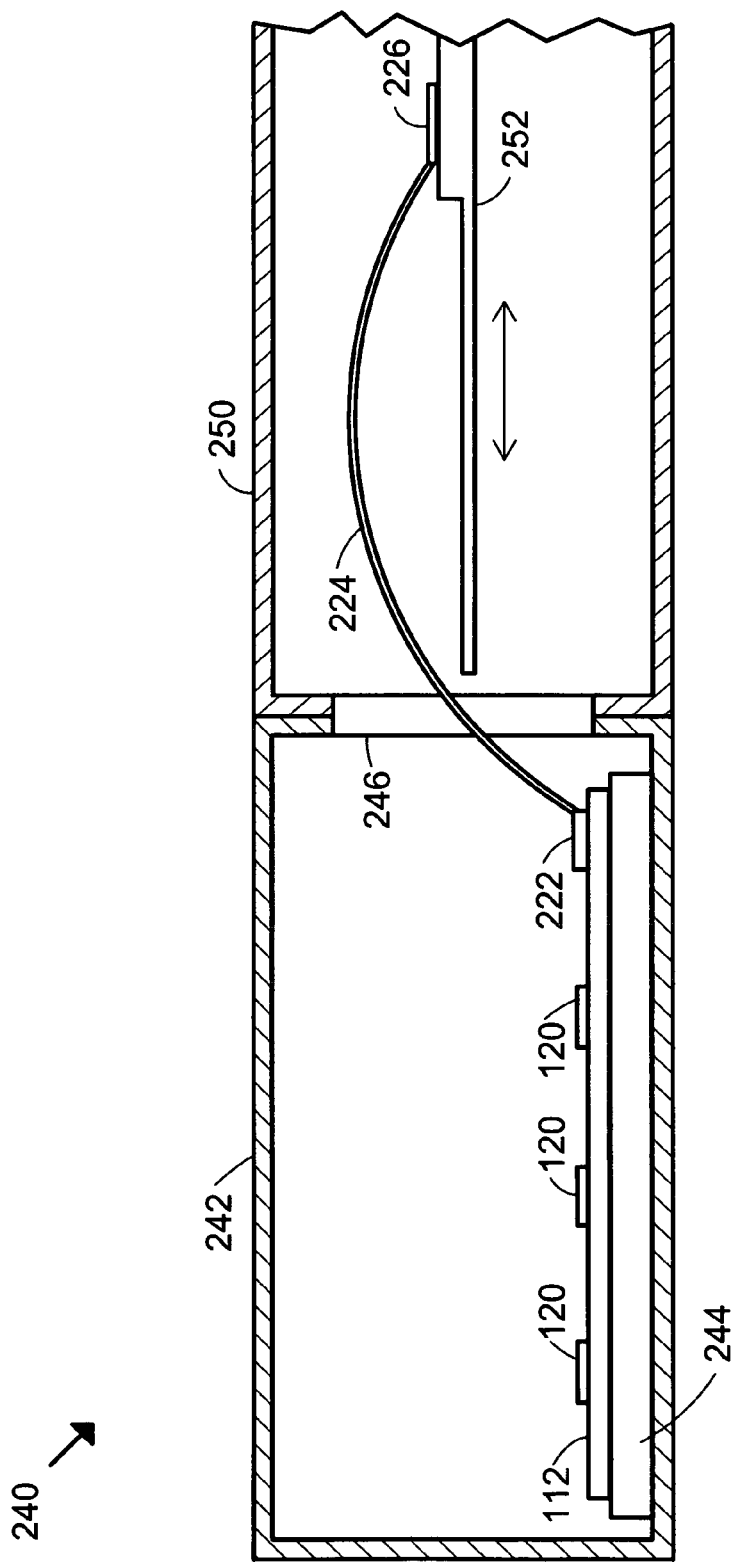
FIG. 13 is a diagram showing the embodiment of FIG. 12 in a process tool according to one embodiment of the present invention.

Reference is now made to FIG. 13 where there is shown an embodiment of the present invention for using a sensor apparatus as described supra. FIG. 13 shows a cross-section side view of a process tool 240 that includes a process chamber 242 and a substrate support 244 in process chamber 242. Process tool 240 also includes a substrate transfer chamber 250 and a robot handler for moving substrates in process tool 240. FIG. 13 shows a cross-section side view of a portion of transfer chamber 250 and a portion of a robot arm 252. Robot arm 252 is configured for back and forth motion as indicated by the doubleheader arrow so as to allow a substrate to be loaded and unloaded from process chamber 242. FIG. 13 shows robot arm 252 positioned in transfer chamber 250.

FIG. 13 also shows a sensor apparatus that is essentially the same as the sensor apparatus described in FIG. 11 and FIG. 12. The sensor apparatus shown in FIG. 13 includes a base 112, sensors 120, and an electronics module that includes a support structure flexible circuit board 222, an elongated ribbon cable 224, and a flexible circuit board 226. In preferred embodiments, flexible circuit board 226 includes electronic components for the sensor apparatus configured as described for FIG. 11. The base of the sensor apparatus is positioned on substrate holder 244. In other words, the base of the sensor apparatus is placed as a substrate would be placed during processing. Elongated ribbon cable 224 is extended so that flexible circuit board 226 can be disposed away from substrate support 244; for this embodiment, flexible circuit board 226 is supported on robot arm 252.

In this configuration, flexible circuit board 226 is sufficiently far away so that base 112 can be heated to high temperatures or subjected to possibly other process conditions that would be harsh for commonly used electronic devices without causing significant damage to electronic components on flexible circuit board 226. The sensor apparatus can be used to measure process conditions without significant modifications to the process tool; the sensor apparatus is fully contained within the process tool while the measurements are being made. Alternative methods of using embodiments of the present invention will be clear to those of ordinary skill in the art. Some of the available alternatives will be determined by the configuration of the process tool and the requirements for performing the measurements. For other configurations, a sufficiently large process chamber may allow circuit board 226 to be placed in the process chamber during the measurements and still allow for circuit board 226 to be placed sufficiently far from exposure to harsh process conditions.

One embodiment of the present invention comprises a method of measuring process conditions using the sensor apparatus described in FIG. 11 and FIG. 12. The method includes the step of loading the sensor apparatus into a process tool. The method also includes the step of placing the base of the sensor apparatus so that the base and sensors can be subjected to the process conditions used for processing substrates and placing the electronic components sufficiently far from the base so that the electronic components are not significantly affected by the process conditions. The method further includes subjecting the base and the sensors to the process conditions while measuring and recording the process conditions using the electronic components, while the base, the sensors, and the electronic components are held in the process tool. Preferably, the method further includes the step of using a robot handler for moving the sensor apparatus.

Figure 14:
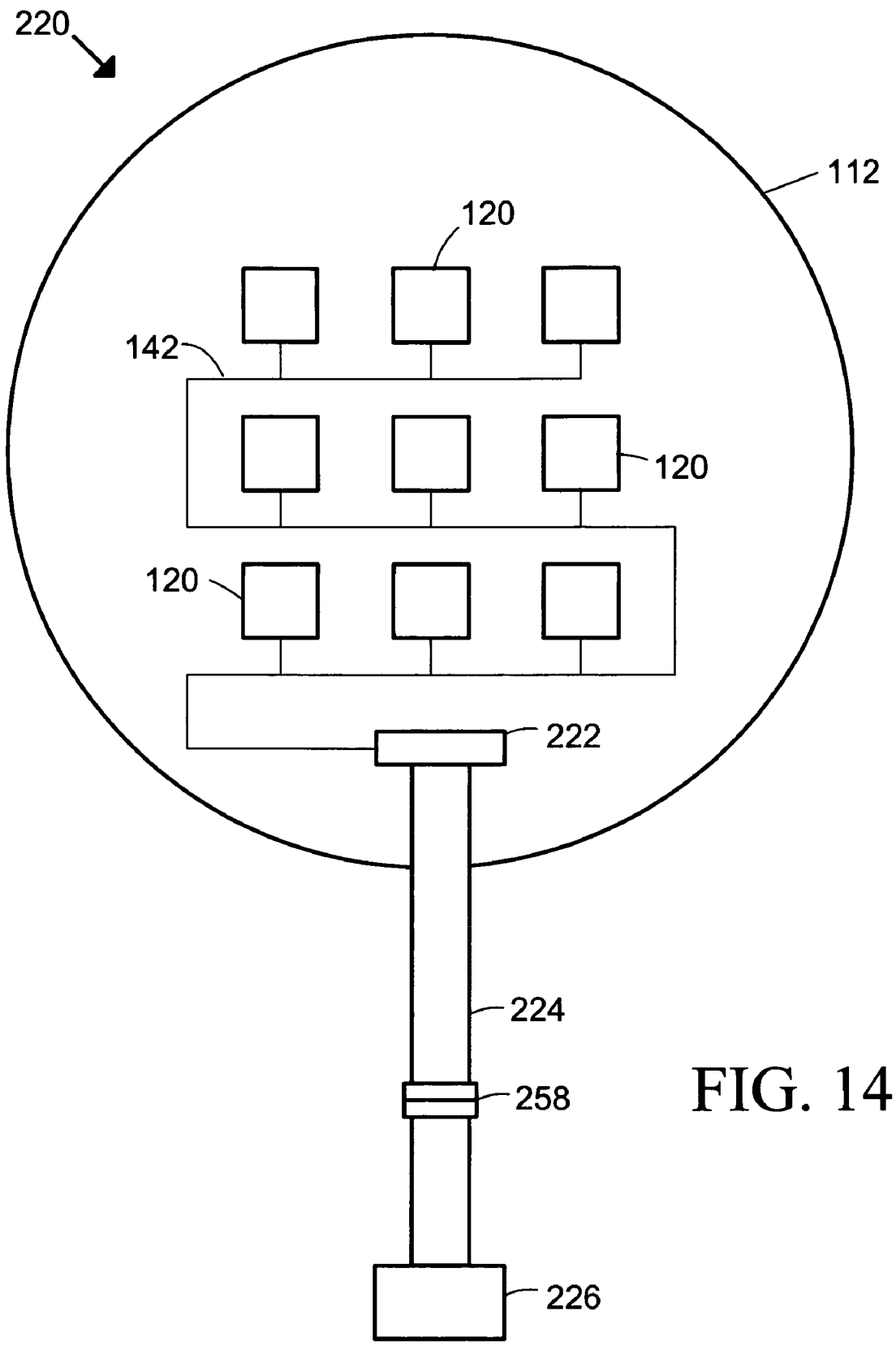
FIG. 14 is a diagram showing a top view of an embodiment of the present invention.

Reference is now made to FIG. 14 where there is shown an embodiment of the present invention that is essentially the same as the embodiment shown in FIG. 11, FIG. 12, and FIG. 13. As another option for embodiments of the present invention, an electrical connector 258 may be provided for use with ribbon cable 224 so as to allow circuit board 226 to be disconnected from support structure flexible circuit board 222. Electrical connector 258 is configured to be reversibly connectable so that it can be connected and disconnected repeatedly. In other words, electrical connector 258 is incorporated with the sensor apparatus so that parts of the sensor apparatus are interchangeable with substantially analogous parts.

One possible configuration for the location of connector 258 is shown in FIG. 14. Optionally, the location of connector 258 can be placed at substantially any location along the length of ribbon cable 224 or even at either end of ribbon cable 224. It is also to be understood that embodiments of the present invention that use a flexible circuit board as a replacement for ribbon cable 224 can also include connector 258 substantially as described for ribbon cable 224. There are numerous commercially available electrical connectors that can be used for connector 258.

Figure 15:
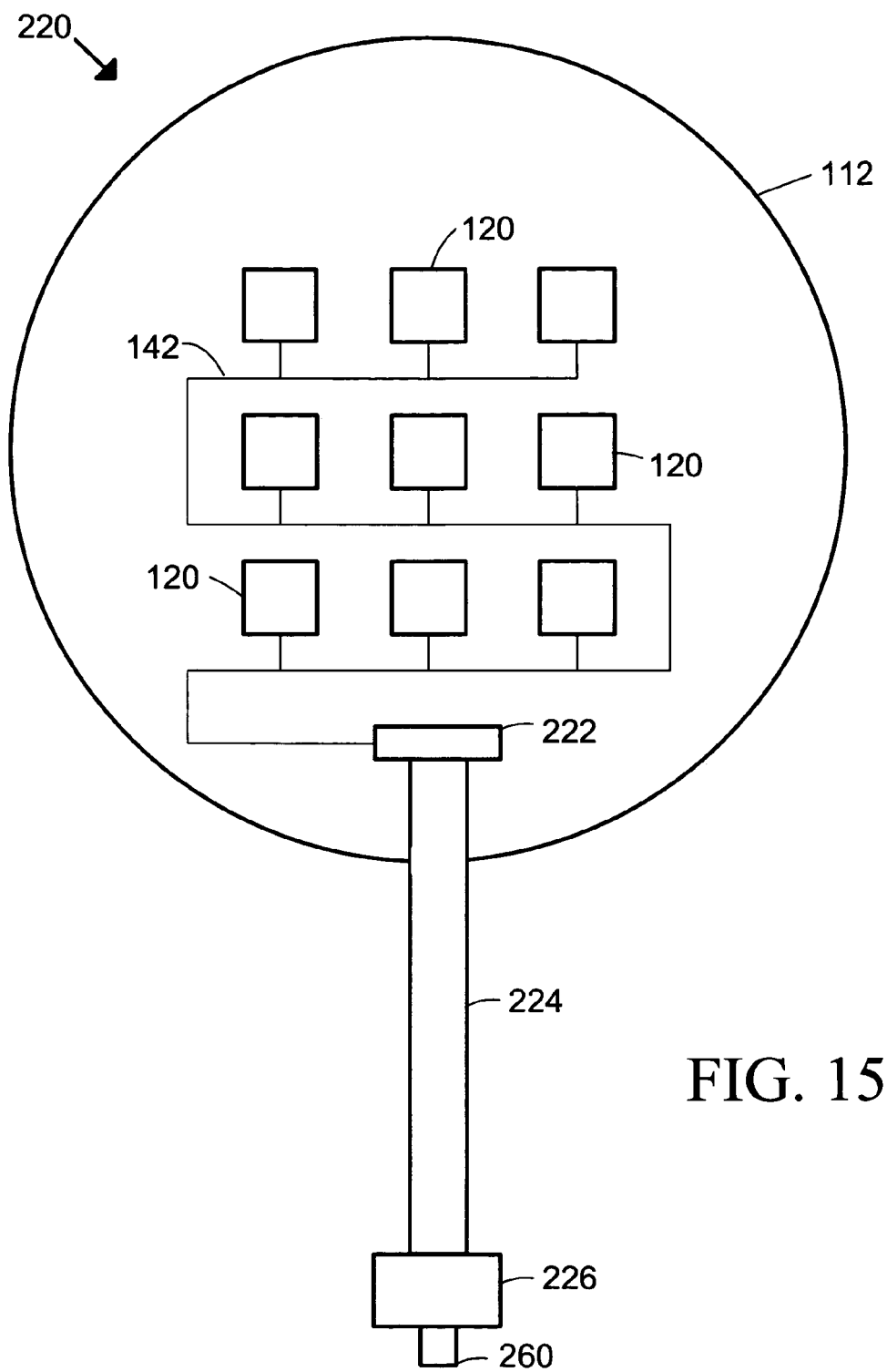
FIG. 15 is a diagram showing a top view of an embodiment of the present invention.

Reference is now made to FIG. 15 where there is shown another embodiment of the present invention. The embodiment shown in FIG. 15 is substantially the same as the embodiments described for FIG. 11, FIG. 12, and FIG. 13 with the exception that the embodiment in FIG. 15 also includes a fastener 260. Preferably, fastener 260 is coupled with circuit board 226 so that circuit board 226 can be fastened to a robot arm section such as that shown in FIG. 13. Alternatively, fastener 260 may be coupled to ribbon cable 224 at a location near circuit board 226; the placement of fastener 260 is selected so as to allow a substantially stable attachment of circuit board 226 to the robot arm section.

A variety of configurations can be used for fastener 260. Some examples of suitable types of fasteners for fastener 260 are clasps, hooks, loops, press studs, magnets, snaps, pins, and clips such as spring-loaded clips such as alligator clips. In view of the present disclosure, alternative configurations for fastener 260 for embodiments of the present invention will be clear to persons of ordinary skill in the art.

Figure 16:
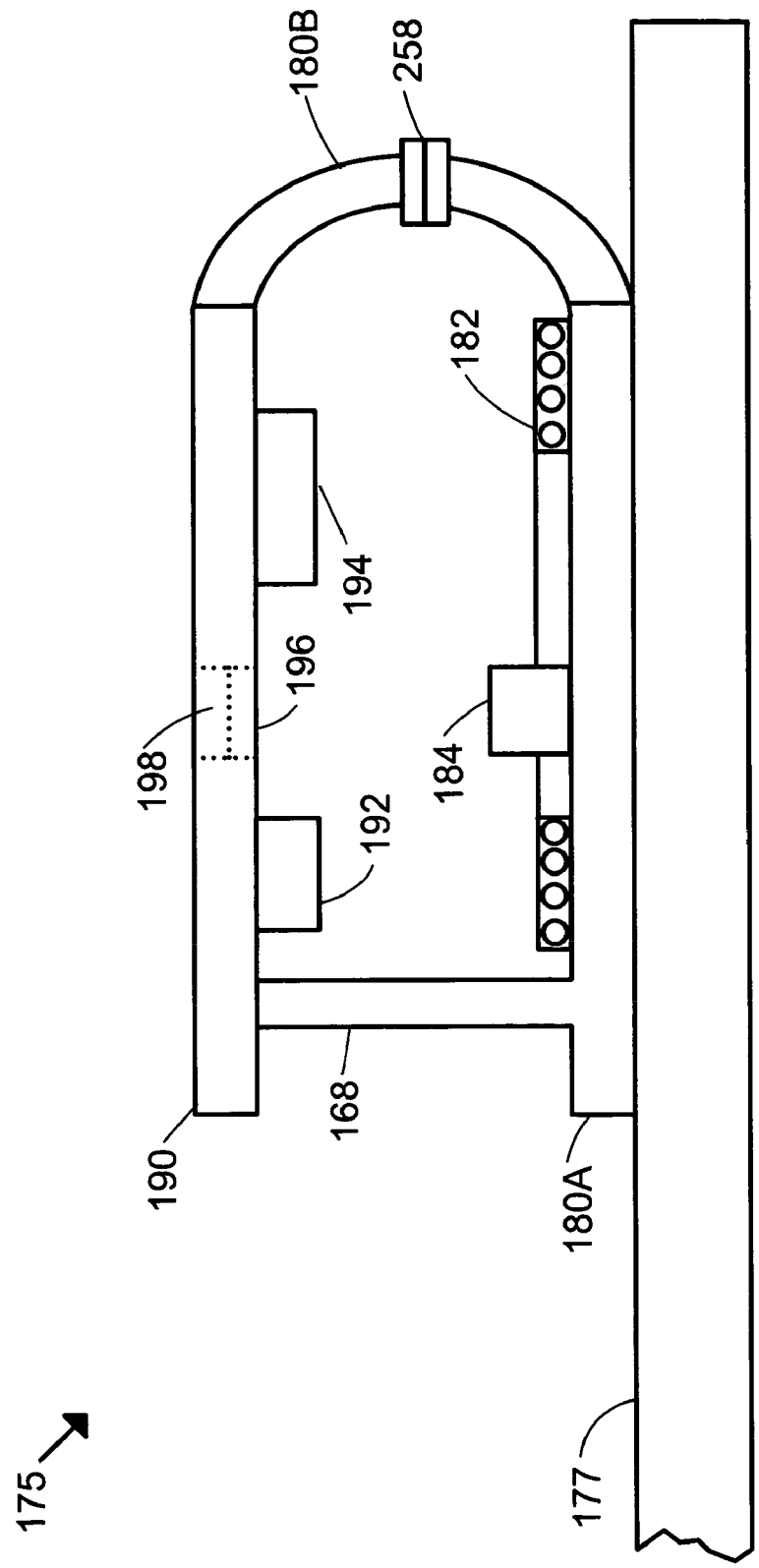
FIG. 16 is a diagram showing a side view of an embodiment of the present invention.

Reference is now made to FIG. 16 where there is shown an embodiment of the present invention substantially the same as that shown in FIG. 9. The embodiment shown in FIG. 16 further includes an electrical connector 258. Electrical connector 258, such as a ribbon cable electrical connector or such as a printed circuit board connector, is incorporated with ribbon cable 180B so as to allow circuit board 190 to be disconnected from circuit board 180A. In other words, electrical connector 258 is incorporated with the sensor apparatus so that parts of the sensor apparatus are interchangeable with substantially analogous parts. One possible configuration for the location of connector 258 is shown in FIG. 16. Optionally, the location of connector 258 can be placed at substantially any location along the length of ribbon cable 180B or even at either end of ribbon cable 180B. It is also to be understood that embodiments of the present invention that use a flexible circuit board as a replacement for ribbon cable 180B can also include connector 258 substantially as described for ribbon cable 180B. There are numerous commercially available electrical connectors that can be used for connector 258.

Figure 17:
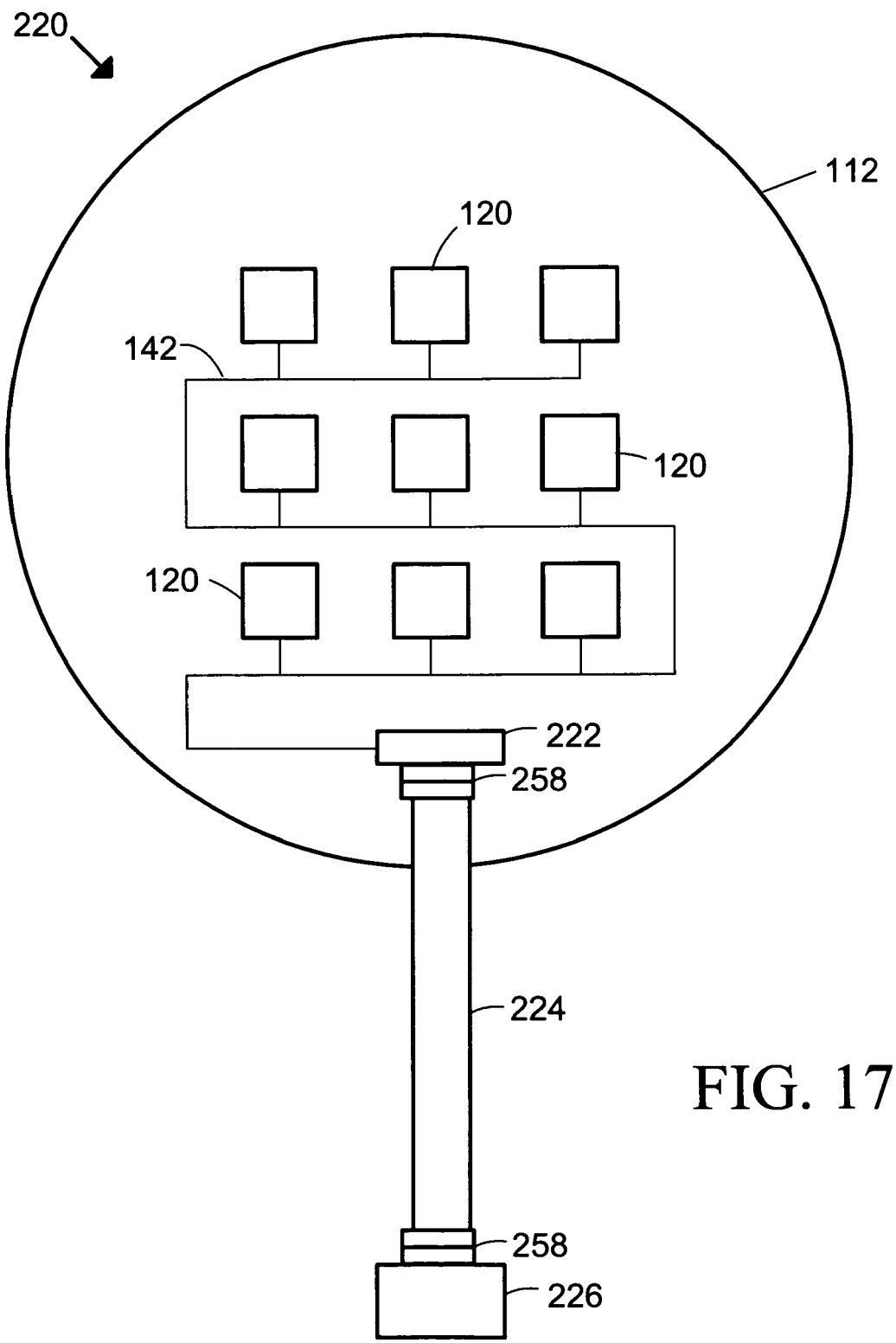
FIG. 17 is a diagram showing a top view of an embodiment of the present invention.

Reference is now made to FIG. 17 where there is shown an embodiment of the present invention that is essentially the same as the embodiment shown in FIG. 14 with the exception that the embodiment shown in FIG. 17 includes an electrical connector 258 attached substantially adjacent to circuit board 222 and another electrical connector 258 attached substantially adjacent to circuit board 226. In other words, ribbon cable 224 is connected with circuit board 226 through electrical connector 258 at one end of ribbon cable 224 and ribbon cable 224 is connected with circuit board 222 through electrical connector 258 at the other end of ribbon cable 222. As another option for embodiments of the present invention, the two electrical connectors allow ribbon cable 224 to be disconnected from circuit board 222 and circuit board 226; this configuration makes it possible to replace ribbon cable 224 with another ribbon cable or with a flexible printed circuit board. Optionally, ribbon cable 224 may be replaced with a short ribbon cable, an elongated ribbon cable, an elongated printed circuit board, or a short printed circuit board. Electrical connector 258 is configured to be reversibly connectable so that it can be connected and disconnected repeatedly. The electrical connectors are incorporated with the sensor apparatus so that parts of the sensor apparatus are interchangeable with substantially analogous parts.

Figure 18A:
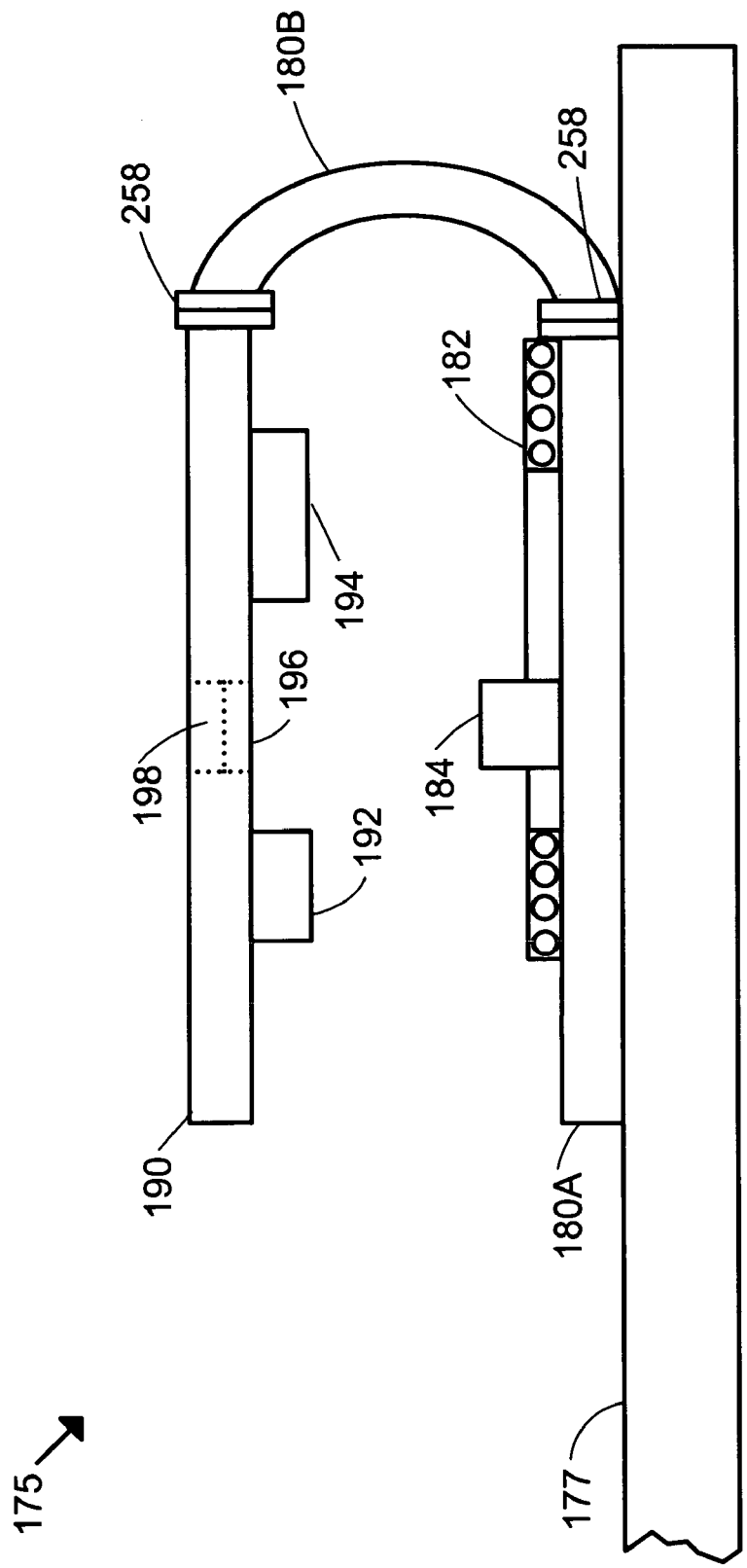
FIG. 18A is a diagram showing a side view of an embodiment of the present invention.

Reference is now made to FIG. 18A where there is shown an embodiment of the present invention substantially the same as that shown in FIG. 16. The embodiment shown in FIG. 18A further includes a second electrical connector 258 incorporated with ribbon cable 180B so as to allow ribbon cable 180B to be disconnected from circuit board 190 and to be disconnected from circuit board 180A. The embodiment shown in FIG. 18A has one electrical connector 258 at one end of ribbon cable 180B and the second electrical connector 258 at the other end of ribbon cable 180B.

Figure 18B:
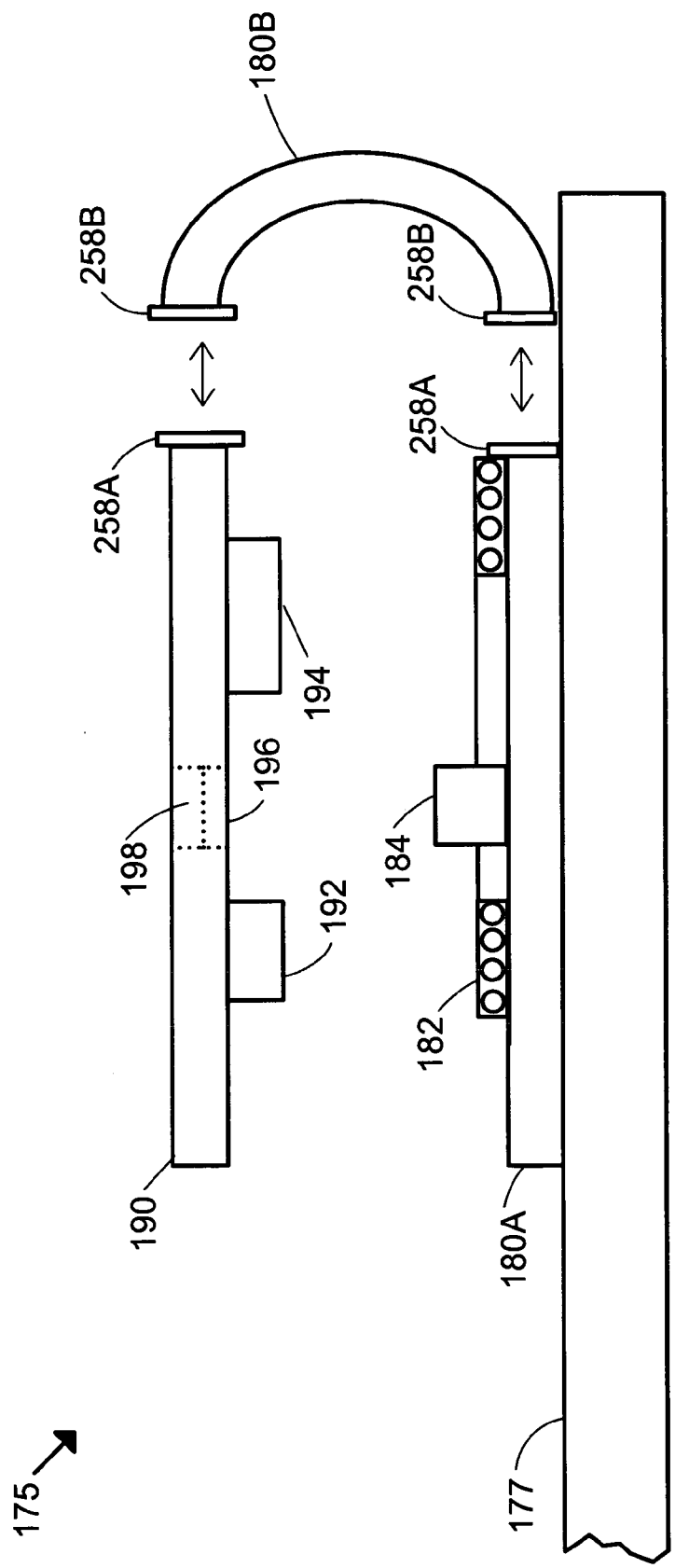
FIG. 18B is a diagram showing a side view of the embodiment of FIG. 18A with an element disconnected.

Reference is now made to FIG. 18B where the embodiment described for FIG. 18A is shown with ribbon cable 180B detached from circuit board 190 and circuit board 180A. The electrical connectors are incorporated with the sensor apparatus so that parts of the sensor apparatus are interchangeable with substantially analogous parts. Embodiments of the present invention as described for FIG. 18A and FIG. 18B provide the option of replacing ribbon cable 180B with a short ribbon cable, an elongated ribbon cable, an elongated printed circuit board, or a short printed circuit board. It is also to be understood that embodiments of the present invention that use a flexible circuit board as a replacement for ribbon cable 180B can also include connector 258 substantially as described for ribbon cable 180B.

Another embodiment of the present invention includes a method of using an electronics module according to embodiments of the present invention such as the embodiment shown in FIG. 17 and the embodiment shown in FIG. 18A. The method includes the step of configuring the middle section so as to comprise an elongated ribbon cable or an elongated printed circuit board. The next step includes using the electronics module for a first application. Another step includes replacing the elongated ribbon cable or elongated printed circuit board with a short ribbon cable or a short printed circuit board and using the electronics module for a second application. Optionally, yet another step includes replacing the short ribbon cable with an elongated ribbon cable or an elongated printed circuit board.

Another embodiment of the present invention includes a method of making low distortion measurements of a process parameter in a process chamber for processing workpieces. The process chamber is connected with a robot that has a robot arm for loading and unloading the workpieces. The method includes the step of providing a sensor apparatus having a substrate, a plurality of sensors, at least one electronic component for information processing supported on a printed circuit board, an elongated ribbon cable, and a fastener. The plurality of sensors is supported on the substrate. The ribbon cable is electrically connected with the sensors and the at least one electronic component. The fastener is coupled to the printed circuit board or to the elongated ribbon cable so that the circuit board can be removably attached to the robot arm. In other words, the circuit board can be attached to and detached from the robot arm as needed. The method further includes the steps of using the fastener to attach the circuit board to the robot arm, using the robot to place the substrate in the process chamber, and positioning the robot arm so as to create a predetermined separation between the substrate and the circuit board. Still further, the method includes the steps of establishing the process conditions for the parameter measurements, measuring the parameters with the sensors and collecting the measurements with the at least one electronic component, using the robot to remove the substrate from the process chamber, and detaching the circuit board from the robot arm. Optionally, the predetermined distance can be selected so that the robot arm remains in the process chamber while measuring the parameters. Alternatively, the predetermined distance can be selected so that the robot arm is positioned in a transfer chamber adjacent to the process chamber while measuring the parameters.

Embodiments of the present invention can allow the measurement of highly accurate data. In other words, embodiments of the present invention allow the measurement of substantially correct temperature distributions over time and space for a workpiece in a manufacturing process that is substantially un-perturbed by the sensor apparatus.

Embodiments of the invention are particularly suited to applications such as characterizing bake plates used for heating semiconductor wafers and characterizing plasma chambers for processing semiconductor wafers. Embodiments of the present invention can allow such characterizations substantially without artifacts obscuring the behavior of the process and the process controllers such as temperature controllers. Embodiments of the present invention can be used to expand the characterization of process operations to real-time, transient behavior, and thus making the characterization much more relevant to the processing of actual workpieces such as semiconductor wafers for electronic devices and flatpanel display substrates for flatpanel displays.

As a specific example, embodiments of the present invention can allow determination of the behavior of photoresist under precisely measured transient process conditions such as process steps involving heat transfer. The information gained using embodiments of the present invention can be used to optimize the overall process for manufacturing products such as electronic devices. Embodiments of the present invention provide opportunities for determining and controlling critical parts of processes and process conditions used in the production of high-value products. In one test of an embodiment of the present invention, temperature measurements were obtained using a sensor apparatus designed according to the teachings of the present invention. The electronics module had such a low impact on the heat dynamics of the bake plate that the controller function was unaffected by the presence of the electronics module.

Embodiments of the present invention can be used to accurately identify workpiece temperature nonuniformities that may occur in electronic device manufacturing processes. Imperfections in components that are part of semiconductor process tools, components such as bake plates and such as plasma chamber chucks, can be localized using embodiments of the present invention. Embodiments of the present invention can be used to analyze the transient temperature behavior of workpieces and thus to determine the impact of the imperfections on the process results for the workpiece.

Embodiments of the present invention can also be used to obtain increased accuracy in "matching" process tools such as semiconductor wafer processing tools and flatpanel display processing tools. For some technologies, this methodology is referred to as chamber matching. Specifically, it is typically preferable for multiple process chambers performing the same process to provide substantially the same process results. This means that each chamber needs to produce substantially the same process conditions for workpieces. The high accuracy information that can be obtained using embodiments of the present invention allows for greater accuracy for chamber matching. In addition, embodiments of the present invention make it easier to incorporate steady state information and transient information in the chamber matching methodologies.

The examples given earlier describe the use of a sensor apparatus having a single electronics module. However, in some applications it may be necessary to have several electronics modules included with the sensor apparatus so as to achieve very high spatial resolution of the parameter measurements. In other words, high-resolution temperature measurements may require a large number of temperature sensors. Handling information from the large number of temperature sensors may require the use of multiple electronics modules. Embodiments of the present invention may also include use of a sensor apparatus having multiple electronics modules. The implementation of embodiments of the present invention for use with a sensor apparatus having multiple electronics modules is substantially analogous to that described for implementation with a single electronics module.

For some applications of embodiments of the present invention, there may be circumstances in which it is necessary to protect at least a portion of the sensor apparatus from the measurement environment. Some techniques that can be used to provide the protection include techniques such as engineering barrier layers, providing protective coverings, and other methods. A preferred embodiment of the present invention includes a thin, substantially conformal, coating of a corrosion resistant material over parts of the electronics module that may be damaged by the process conditions.

Clearly, embodiments of the present invention can be used for a wide variety of applications that require data acquisition for development, optimization, monitoring, and control of processes and process tools used for processing workpieces. Capabilities and features of embodiments of the present invention are particularly suited for processing high-value workpieces such as semiconductor wafers and flat panel displays.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

While there have been described and illustrated specific embodiments of the invention, it will be clear that variations in the details of the embodiments specifically illustrated and described may be made without departing from the true spirit and scope of the invention as defined in the appended claims and their legal equivalents.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

As used herein, the terms "comprises," "comprising," "includes," "including," "has," "having," "at least one of," or any other variation thereof, are intended to cover a non-exclusive inclusion. For example, a process, method, article, or apparatus that comprises a list of elements is not necessarily limited only to those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

What is claimed is:

1. A sensor apparatus comprising:
   a base having a substantially rigid surface;
   at least one sensor in physical contact with the base; and
   an electronics module comprising components for information-processing and a support structure for suspending at least one of the components away from the surface of the base, the at least one sensor being connected with the components so as to provide signals representing measurements of a process parameter, the support structure having at least one of:
      a thermal resistance so that the measurements are substantially unperturbed by the presence of the electronics module and the electronics module is substantially undamaged by heat transferred from the base to the electronics module and
      a thermal mass so that the measurements from the sensors are substantially unperturbed by the presence of the electronics module.

2. The sensor apparatus of claim 1 further comprising a printed circuit board interconnecting the components for information processing, the printed circuit board being flexibly coupled to the support structure so that the components for information-processing can be moved from a first position to a second position.

3. The sensor apparatus of claim 2 further comprising a latch mechanism for holding the printed circuit board in the first position.

4. The sensor apparatus of claim 1, wherein at least a portion of the support structure is substantially flexible.

5. The sensor apparatus of claim 1, wherein the support structure comprises at least a substantially flexible portion and the flexible portion is connected with the base.

6. The sensor apparatus of claim 1, wherein at least a portion of the support structure is substantially flexible so that at least one of the components suspended away from the base can be held in a closed position or in an opened position.

7. The sensor apparatus of claim 1, wherein the components for information processing and the support structure are flexibly coupled so that the components for information-processing can be moved from a first position to a second position.

8. The sensor apparatus of claim 1 further comprising a flexible printed circuit board interconnecting the components for information processing, the printed circuit board being flexibly coupled to the support structure so that the components for information-processing can be moved from a first position to a second position.

9. The sensor apparatus of claim 1 wherein the support structure comprises a flexible printed circuit board connected with the at least one sensor so as to receive the signals.

10. The sensor apparatus of claim 1 further comprising circuitry for electrical communication between the components for information processing and the at least one sensor.

11. The sensor apparatus of claim 1 wherein the base comprises a substantially whole semiconductor wafer.

12. The sensor apparatus of claim 1 wherein the base comprises a substrate for a lithography mask.

13. The sensor apparatus of claim 1 wherein the at least one sensor comprises a temperature sensor.

14. The sensor apparatus of claim 1 wherein the at least one sensor comprises a plurality of temperature sensors selected from the group consisting of resistor temperature dependent sensors, thermistors, and thermocouples.

15. The sensor apparatus of claim 1 wherein the at least one sensor comprises a plurality of sensors selected from the group consisting of etch rate sensor, deposition rate sensor, thermal flux sensor, optical radiation sensor, and resistivity sensor.

16. A method of making low distortion measurements of a process parameter in a process chamber for processing workpieces, the process chamber being connected with a robot having a robot arm for loading and unloading the workpieces, the method comprising the steps of:
  A. providing a sensor apparatus having a substrate, a plurality of sensors, at least one electronic component for information processing supported on a printed circuit board, an elongated ribbon cable or an elongated flexible circuit board, and a fastener; the plurality of sensors being supported on the substrate, the elongated ribbon cable or the elongated flexible circuit board being electrically connected with the sensors and the at least one electronic component; the fastener being coupled to the printed circuit board or to the elongated ribbon cable or the elongated flexible circuit board so that the printed circuit board can be removably attached to the robot;
  B. using the fastener to attach the circuit board to the robot arm;
  C. using the robot to place the substrate in the process chamber;
  D. positioning the robot arm so as to create a predetermined separation between the substrate and the printed circuit board;
  E. establishing the process conditions for the parameter measurements;
  F. measuring the parameters with the sensors and collecting the measurements with the at least one electronic component;
  G. using the robot to remove the substrate from the process chamber; and
  H. detaching the circuit board from the robot arm.

17. The method of claim 16 wherein the robot arm remains in the process chamber or in an adjacent chamber during step F.

18. The method of claim 16 wherein the robot arm remains in the process chamber or is withdrawn from the process chamber during step F.

19. The method of claim 16 wherein the process chamber has a port; the method further comprising the step of providing a gate for opening and closing the port; wherein step C comprises placing the substrate in the process chamber through the port; wherein step D comprises withdrawing the robot arm from the process chamber so that the elongated ribbon cable or the elongated flexible circuit board is extended through the port and closing the gate on the elongated ribbon cable or the elongated flexible circuit board; and wherein step G comprises opening the gate.

20. A method of using an electronics module for a sensor apparatus for attachment to a base, the base having at least one sensor mounted thereon, the electronics module being connected with the at least one sensor so as to receive signals from the sensor, the electronics module having: a bottom section comprising a circuit board having wiring and a plurality of electrical contacts; a remote section comprising a circuit board and a plurality of components for electronically processing information; a first electrical connector configured so as to make reversible electrical connections, a second electrical connector configured so as to make reversible electrical connections, and a middle section comprising a structure for transmitting information, the middle section having a first end and a second end, the first end of the middle section being coupled to the bottom section with the first electrical connector, and the second and other middle section being coupled to the remote section with the second electrical connector, wherein, the bottom section physically connects with the base, the method comprising the steps of:
  configuring the middle section so as to comprise an elongated ribbon cable or an elongated printed circuit board;
  using the electronics module for a first application;
  replacing the elongated ribbon cable or elongated printed circuit board with a short ribbon cable or a short printed circuit board; and
  using the electronics module for a second application.

21. The method of claim 20 further comprising the step of configuring the middle section so as to comprise an elongated ribbon cable or an elongated printed circuit board after using the electronics module for the second application.

22. A sensor apparatus for measuring temperatures for processing silicon wafers, the sensor apparatus comprising:

a substantially whole silicon wafer;

a plurality of temperature sensors in physical contact with the silicon wafer so as to provide temperature measurements; and at least one electronics module mounted on the silicon wafer, the electronics module comprising an information processor, a power supply, a flexible integrated circuit board comprising polyimide, and a support structure comprising polyimide, the information processor, the power supply, and the sensors being interconnected via the flexible circuit board so that the information processor can receive power from the power supply and signals from the sensors, the support structure being flexibly coupled to the flexible circuit board, the support structure having electrical circuits for transmitting signals from the sensors to the flexible circuit board, the support structure having a flexible portion for physical contact with the silicon wafer, the support structure being configured for suspending the information processor and the power supply away from the surface of the silicon wafer, the support structure being configured so as to provide a rate of conductive heat transfer between the silicon wafer and the electronics module so that the temperature measurements from the sensors are substantially unperturbed by the presence of the electronics module and the electronics module is substantially undamaged by heat transferred from the base to the electronics module, the support structure having a latch mechanism for holding the printed circuit board in a predetermined position.

23. An electronics module for a sensor apparatus for mounting on a base, the base having at least one sensor mounted thereon, the electronics module being connected with the at least one sensor so as to receive signals from the sensor, the electronics module comprising:

a bottom section comprising a flexible circuit board having wiring and a plurality of electrical contacts;

a top section comprising a circuit board and a plurality of components for electronically processing information; and a middle section comprising a flexible circuit board or a ribbon cable coupled between the bottom section and the top section, wherein, the bottom section physically contacts the base for support and the middle section extends away from the base; and a substantially planar induction coil mounted on the bottom section, the coil being configured for receiving inductively coupled power, the coil being connected with the top section so as to provide power to at least one of the plurality of components.

* * * * *